US009945921B2

(12) United States Patent
Park et al.

(10) Patent No.: US 9,945,921 B2
(45) Date of Patent: Apr. 17, 2018

(54) MAGNETIC RESONANCE IMAGING DEVICE AND CONTROL METHOD THEREOF

(71) Applicants: SAMSUNG ELECTRONICS CO., LTD., Suwon-si (KR); Korea Advanced Institute Of Science and Technology, Daejeon (KR)

(72) Inventors: Hyun Wook Park, Daejeon (KR); Ye Ji Han, Daejeon (KR); Jae Moon Jo, Seongnam-si (KR)

(73) Assignees: SAMSUNG ELECTRONICS CO., LTD., Suwon-si (KR); Korea Advanced Institute Of Science and Technology, Daejeon (KR)

( * ) Notice: Subject to any disclaimer, the term of this patent is extended or adjusted under 35 U.S.C. 154(b) by 775 days.

(21) Appl. No.: 14/504,769

(22) Filed: Oct. 2, 2014

(65) Prior Publication Data
US 2015/0091571 A1 Apr. 2, 2015

(30) Foreign Application Priority Data
Oct. 2, 2013 (KR) .......................... 10-2013-0118115

(51) Int. Cl.
*G01V 3/00* (2006.01)
*G01R 33/563* (2006.01)
(Continued)

(52) U.S. Cl.
CPC ...... *G01R 33/56383* (2013.01); *G01R 33/543* (2013.01); *G01R 33/56509* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2005/0020907 A1 1/2005 Shankaranarayanan et al.
2009/0033327 A1* 2/2009 Aldefeld .......... G01R 33/56375
324/309
(Continued)

FOREIGN PATENT DOCUMENTS

EP 2592432 A1 5/2013
JP 2006-288729 A 10/2006
JP 2009-533128 A 9/2009

OTHER PUBLICATIONS

Communication dated Jan. 12, 2015 by the International Searching Authority in counterpart International Patent Application No. PCT/KR2014/009332 (PCT/ISA/210).
(Continued)

*Primary Examiner* — Walter L Lindsay, Jr.
*Assistant Examiner* — Frederick Wenderoth
(74) *Attorney, Agent, or Firm* — Sughrue Mion, PLLC

(57) ABSTRACT

An MRI apparatus performs an MRI while moving a patient table and includes a main magnet configured to generate a static magnetic field in a bore; a gradient coil assembly configured to apply a gradient signal to the static magnetic field to generate a magnetic field gradient; an RF coil assembly configured to apply an RF excitation signal and an RF refocusing signal; and a controller configured to control the RF refocusing signal so that a slice to which the RF refocusing signal is to be applied conforms to the slice to which the RF excitation signal has been applied.

25 Claims, 21 Drawing Sheets

(51) Int. Cl.
*G01R 33/565* (2006.01)
*G01R 33/54* (2006.01)

(58) Field of Classification Search
USPC .......................................................... 324/309
See application file for complete search history.

(56) References Cited

U.S. PATENT DOCUMENTS

2009/0177076 A1* 7/2009 Aldefeld .......... G01R 33/56375
600/410
2010/0171499 A1 7/2010 Sharp et al.
2010/0289493 A1* 11/2010 Stemmer .......... G01R 33/56375
324/309
2012/0235681 A1 9/2012 Stemmer

OTHER PUBLICATIONS

Communication dated Dec. 5, 2017, from the European Patent Office in counterpart European Application No. 14851111.6.
Yeji Han et al., "Continuously moving table whole-body diffusion weighted imaging using an adaptive gradient reversal technique", Proceedings of the International Society for Magnetic Resonance in Medicine 22 (2014), (p. 2239).
Ute Ludwig et al., "2D Axial Moving Table Acquisitions with Dynamic Slice Adaptation", Magnetic Resonance in Medicine, vol. 55, No. 2, (2006), (pp. 423-430).
H-P. Fautz et al., "Advances in T2-weighted axial moving table acquisitions", Proceedings of the International Society for Magnetic Resonance in Medicine, 13th Scientific Meeting and Exhibition, (2005), (p. 1963).

* cited by examiner

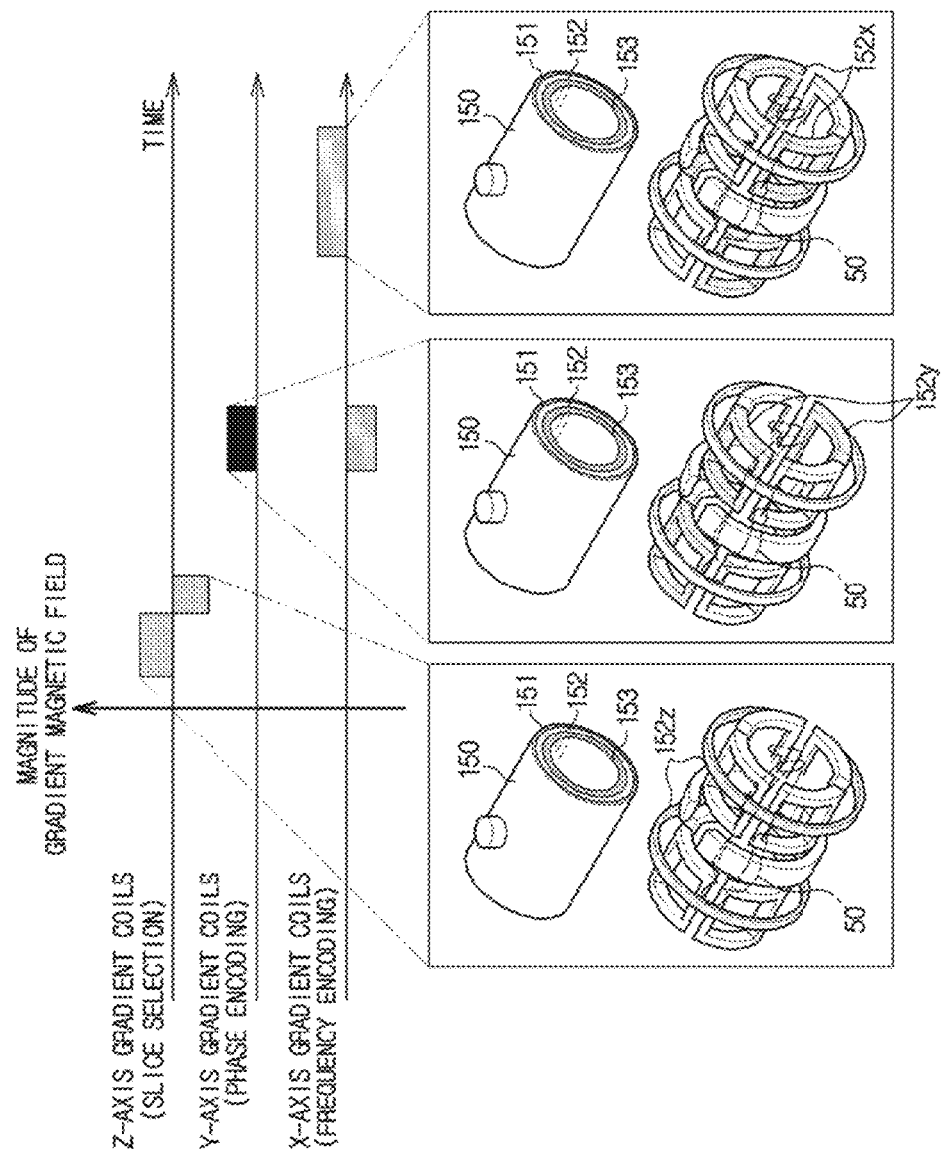

MAGNETIC RESONANCE IMAGING DEVICE AND CONTROL METHOD THEREOF

CROSS-REFERENCE TO RELATED APPLICATION

This application claims priority from Korean Patent Application No. 10-2013-0118115, filed on Oct. 2, 2013 in the Korean Intellectual Property Office, the disclosure of which is incorporated herein by reference in its entirety.

BACKGROUND

1. Field

Apparatuses and methods consistent with exemplary embodiments relate to a magnetic resonance imaging (MRI) apparatus that performs MRI while moving a patient table and a control method thereof.

2. Description of the Related Art

A medical imaging apparatus acquires an image to provide medical examination information of a patient. Examples of the medical imaging apparatuses include an ultrasonic imaging apparatus, an X-ray tomography apparatus, and an MRI apparatus. The MRI apparatus holds an important position in medical imaging since image capturing conditions are relatively easy, contrast in soft tissue is excellent, and various diagnostic information images may be provided.

A continuously moving table (CMT) technique, one of MRI techniques, performs MRI while moving a patient table at a uniform speed to acquire MR data from a position nearest the isocenter of a magnet assembly.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments provide an MRI apparatus that shifts a center frequency of a refocusing radio frequency (RF) from that of an RF excitation signal considering movement distance of a patient table, thereby achieving conformity between a slice selected by the RF excitation signal and a slice selected by the RF refocusing signal, and a control method thereof.

In accordance with an aspect of an exemplary embodiment, an MRI apparatus to perform MRI while moving a patient table includes a main magnet to generate a static magnetic field in a bore, a gradient coil assembly to apply a gradient to the static magnetic field to generate a gradient field, a RF coil assembly to apply an RF excitation signal and an RF refocusing signal, and a controller to control the RF refocusing signal so that a slice to which the RF refocusing signal is to be applied conforms to a slice to which the RF excitation signal has been applied.

The controller may calculate a center frequency of the RF refocusing signal based on a movement distance of the patient table and control the RF coil assembly to apply an RF refocusing signal having the calculated center frequency.

The controller may calculate an offset ($f_{offset}$) from a center frequency of the RF excitation signal based on the movement distance of the patient table.

The controller may calculate a value shifted by the offset calculated from the center frequency of the RF excitation signal as the center frequency of the RF refocusing signal.

The controller may calculate the movement distance of the patient table based on movement speed of the patient table and a time echo and the movement distance of the patient table may be a movement distance between application of the RF excitation signal and application of the RF refocusing signal.

The controller may calculate the offset using Equation 5.

$$f_{offset} = \Delta f = \gamma g_z V(TE)/4\pi,$$ [Equation 5]

where $\gamma$ is a proportional constant, V is movement speed of the patient table, TE is a time echo, and $g_z$ is a variation of the gradient field per unit distance.

The controller may control the gradient coil assembly so that polarity of the gradient field generated when the RF excitation signal is applied is opposite to polarity of the gradient field generated when the RF refocusing signal is applied according to gradient reversal technique.

When MRI for multiple slices is performed, the controller may control the RF coil assembly to apply an RF refocusing signal having a center frequency shifted from the center frequency of the RF excitation signal by the calculated offset to each slice.

When MRI for multiple slices is performed, the controller may control the RF coil assembly to apply an RF excitation signal having a center frequency $f_{s1}$ to a first slice and an RF excitation signal having a center frequency $f_{s1}+f_s$ to a second slice ($f_s$ being an offset according to slice selection) and to apply an RF refocusing signal having a center frequency $f_{s1}+f_{offset}$ ($f_{offset}$ being an offset according to movement of the patient table) to the first slice and an RF refocusing signal having a center frequency $f_{s1}-f_s+f_{offset}$ to the second slice.

The controller may control the RF coil assembly to apply a plurality of refocusing RFs after application of the RF excitation signal according to a multi echo sequence and to shift a center frequency of each refocusing RF according to movement of the patient table.

The controller may adjust the center frequencies of the RF excitation signal and the RF refocusing signal to select order of the multiple slices.

In accordance with another aspect of an exemplary embodiment, a control method of an MRI apparatus to perform MRI while moving a patient table includes generating a static magnetic field in a bore, applying a gradient to the static magnetic field to generate a gradient field, applying an RF excitation signal to select a specific slice, and applying an RF refocusing signal having a center frequency shifted by an offset calculated from a center frequency of the RF excitation signal based on a movement distance of the patient table.

The control method may further include calculating the center frequency of the RF refocusing signal based on the movement distance of the patient table.

The calculating the center frequency of the RF refocusing signal may include calculating an offset ($f_{offset}$) from the center frequency of the RF excitation signal based on the movement distance of the patient table.

The calculating the center frequency of the RF refocusing signal may include calculating a value shifted by the offset calculated from the center frequency of the RF excitation signal as the center frequency of the RF refocusing signal.

The calculating the offset ($f_{offset}$) may include calculating the movement distance of the patient table based on movement speed of the patient table and a time echo and the movement distance of the patient table may be a movement distance between application of the RF excitation signal and application of the RF refocusing signal.

The calculating the offset ($f_{offset}$) may further include calculating the offset using Equation 5.

$$f_{offset} = \Delta f = \gamma g_z V(TE)/4\pi,\qquad\text{[Equation 5]}$$

where γ is a proportional constant, V is movement speed of the patient table, TE is a time echo, and $g_z$ is a variation of the gradient field per unit distance.

The control method may further include generating a gradient field having an opposite polarity to the generated gradient field when the RF refocusing signal is applied.

The control method may further include, when MRI for multiple slices is performed, applying an RF refocusing signal having a center frequency shifted from the center frequency of the RF excitation signal by the calculated offset to each slice.

The control method may further include, when MRI for multiple slices is performed, applying an RF excitation signal having a center frequency $f_{s1}$ to a first slice and an RF excitation signal having a center frequency $f_{s1}+f_s$ to a second slice ($f_s$ being an offset according to slice selection) and applying an RF refocusing signal having a center frequency $f_{s1}+f_{offset}$ ($f_{offset}$ being an offset according to movement of the patient table) to the first slice and an RF refocusing signal having a center frequency $f_{s1}-f_s+f_{offset}$ to the second slice.

The control method may further include applying a plurality of RF refocusing signals and shifting a center frequency of each RF refocusing signal according to movement of the patient table.

BRIEF DESCRIPTION OF THE DRAWINGS

The above and/or other aspects will become more apparent by describing certain exemplary embodiments, with reference to the accompanying drawings, in which:

FIG. 5 is a view showing a pulse sequence related to operation of gradient coils constituting the gradient coil assembly;

DETAILED DESCRIPTION

Figure 1:
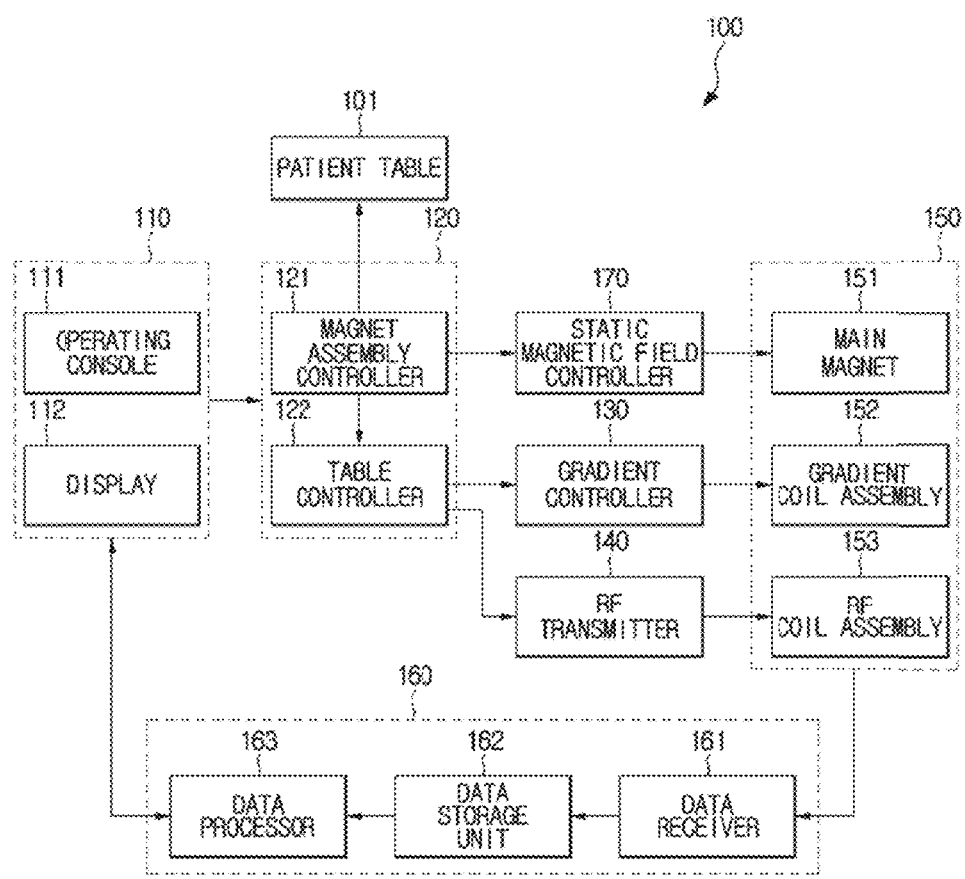
FIG. 1 is a control block diagram of an MRI apparatus according to an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

FIG. 1 is a control block diagram of an MRI apparatus according to an exemplary embodiment.

Referring to FIG. 1, the MRI apparatus 100 includes a magnet assembly 150 to generate a magnetic field and to generate a resonance phenomenon for atomic nuclei, a controller 120 to control operation of the magnet assembly 150, and an image processor 160 to receive an echo signal, i.e., an MR signal, generated from the atomic nuclei and to generate a magnetic resonance image.

The magnet assembly 150 includes a main magnet 151 to generate a static magnetic field, a gradient coil assembly 152 to apply a gradient to the static magnetic field to generate a gradient field, and a radio frequency (RF) coil assembly 153 to apply an RF pulse to an object to excite atomic nuclei and to receive an echo signal from the atomic nuclei.

The MRI apparatus 100 further includes a patient table 101 to transfer the object into an inner space, i.e., a bore, of the magnet assembly 150. The controller 120 includes a magnet assembly controller 121 to control operation of the magnet assembly 150 and a table controller 122 to control movement of the patient table 101. The magnet assembly controller and the table controller 122 may be embodied using one processor or different processors.

The magnet assembly controller 121 controls intensity and direction of the static magnetic field generated by the main magnet 151. In addition, the magnet assembly controller 121 generates a pulse sequence suitable for a diagnostic region or diagnostic purpose of the object and controls the gradient coil assembly 152 and the RF coil assembly 153 according to the pulse sequence.

The MRI apparatus 100 further includes a static magnetic field controller 170 to apply a static magnetic field current for static magnetic field generation to the main magnet 151, a gradient controller 130 to apply a gradient current for gradient field generation to the gradient coil assembly 152, and an RF transmitter 140 to apply an RF current for RF generation to the RF coil assembly 153.

The magnet assembly controller 121 may control the main magnet 151, the gradient coil assembly 152, and the RF coil assembly 153 through the static magnetic field controller 170, the gradient controller 130, and the RF transmitter 140 to control the static magnetic field generated in the bore, the gradient field, and the RF signal applied to the atomic nuclei.

The RF coil assembly 153 is connected to the image processor 160. The image processor 160 includes a data receiver 161 to receive data regarding an MR signal generated from the atomic nuclei, a data storage unit 162 to store data received from the data receiver 161, and a data processor 163 to process the stored data to generate a magnetic resonance image.

The data receiver 161 may include a preamplifier to amplify an MR signal received by the RF coil assembly 153, a phase detector to receive the MR signal from the preamplifier to perform phase detection, and an analog/digital (A/D) converter to convert an analog signal acquired through phase detection into a digital signal. The data receiver 161 transmits a digitized MR signal to the data storage unit 162.

The data storage unit 162 has a data space constituting a two-dimensional (2D) Fourier space. When storage of all scanned data is completed, the data processor 163 performs 2D inverse Fourier transform on data in the 2D Fourier space to reconfigure an image of the object.

The MRI apparatus 100 may include a user interface 110 which may receive a control command regarding operations of the MRI apparatus 100 from a user through an operating console 111. Particularly, upon receipt of a command regarding a scan sequence to be applied to scan the object from the user, the magnet assembly controller 121 may design a pulse sequence suitable for the scan sequence.

A display 112 may display various kinds of information regarding control of the MRI apparatus 100 and an image generated by the image processor 160 so that the user diagnoses a health state of the object.

Figure 2:
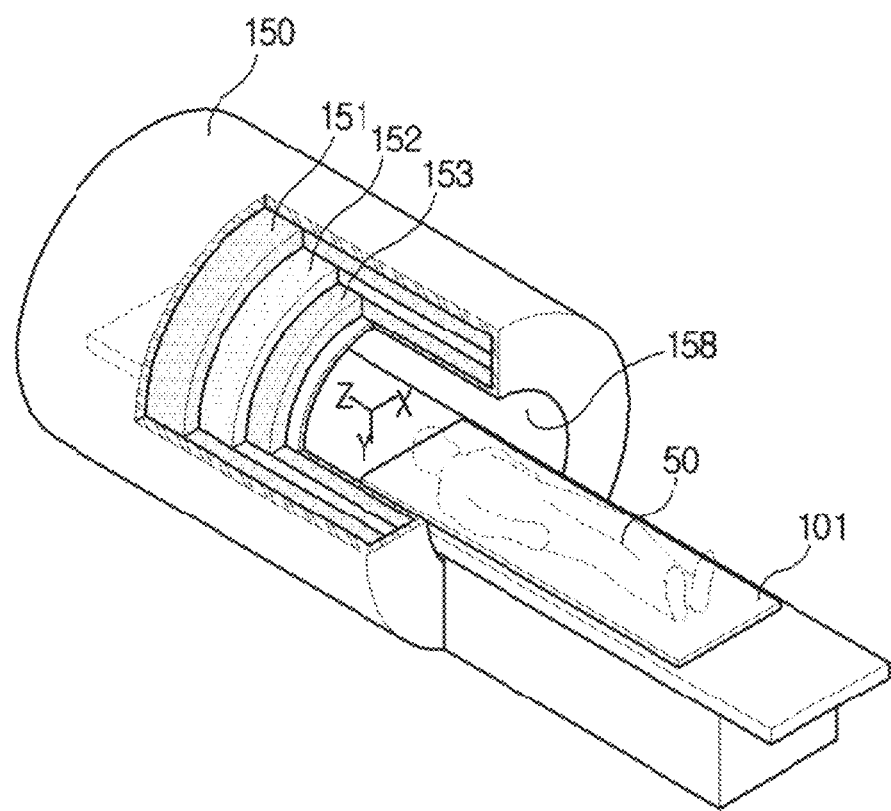
FIG. 2 is a view schematically showing the external appearance of the MRI apparatus.
Figure 3:
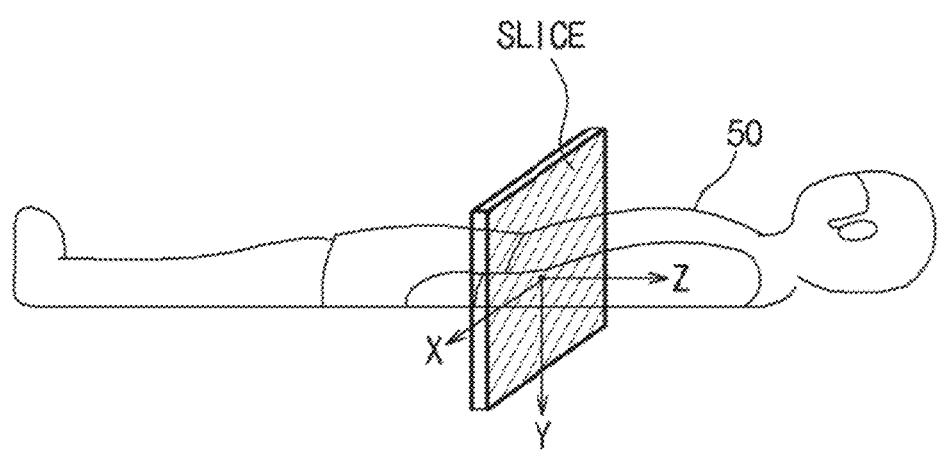
FIG. 3 is a view showing a space, in which an object lies, divided into x, y, and z axes.

FIG. 2 is a view schematically showing the external appearance of the MRI apparatus, FIG. 3 is a view showing a space, in which the object is placed, which is divided into X, Y, and Z axes, and FIG. 4 is a view showing the structure of the magnet assembly and the structure of the gradient coil assembly.

Referring to FIG. 2, the magnet assembly 150 is formed in a cylindrical shape having a hollow inner space or a bore 158, which is referred to as a gantry. The patient table 101 transfers an object 50 lying thereon into the bore.

The main magnet 151, the gradient coil assembly 152, and the RF coil assembly 153 are mounted in the magnet assembly 150.

The main magnet 151 includes a coil to generate a static magnetic field in the bore, which is referred as a main magnet. The main magnet may be embodied using a superconductive magnet. In this case, the main magnet 151 includes a superconductive coil.

The main magnet 151 may be configured so that a coil is wound around the bore. When current from the static magnetic field controller 170 is applied to the main magnet 151, a static magnetic field is generated in the bore. Generally, the direction of the static magnetic field is parallel to the longitudinal axis of the magnet assembly 150.

When the static magnetic field is generated in the bore, atomic nuclei of atoms, especially hydrogen atoms, constituting the object 50 are arranged in the direction of the static magnetic field and perform precession about the direction of the static magnetic field. Precession speed of the atomic nuclei may be indicated by precession frequency. The precession frequency is referred to as a Larmor frequency, which is represented by the following equation 1.

$$\omega = \gamma B_0 \qquad \text{[Equation 1]}$$

where, $\omega$ is a Larmor frequency,
$\gamma$ is a proportional constant, and
$B_0$ is intensity of an external magnetic field.

The proportional constant is different for each kind of atomic nuclei. A unit of the intensity of the external magnetic field is tesla (T) or gauss (G). A unit of the precession frequency is Hz.

For example, a hydrogen proton has a precession frequency of 42.58 MHz in an external magnetic field of 1 T. Since hydrogen constitutes majority of the atoms constituting the human body, the MRI apparatus mainly obtains an MR signal using precession of hydrogen protons.

As shown in FIG. 3, on the premise that the longitudinal axis of the object 50 is parallel to that of the magnet assembly 150, an axis parallel to the longitudinal axis of the object 50 from the head to the feet of the object 50, i.e., an axis parallel to the direction of the static magnetic field, may be set as a Z axis, an axis parallel to the lateral direction of the object 50 may be set as an X axis, and an axis parallel to the vertical direction of a diameter of a bore may be set as a Y axis.

When the longitudinal axis of the object 50 is parallel to the direction of the static magnetic field, a tomographic image for a cross section of the object 50 may be obtained. A slice having a predetermined thickness may be selected to obtain the tomographic image.

Gradient fields in the X, Y, and Z axes may be needed to obtain three-dimensional (3D) space information regarding an MR signal. For example, the gradient coil assembly 152 includes three pairs of gradient coils corresponding to the X, Y, and Z axes.

Figure 4A:
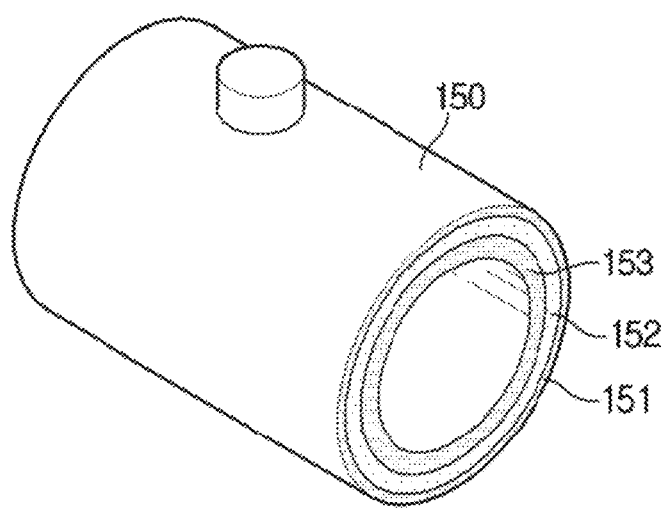
FIGS. 4A and 4B are views showing the structure of a magnet assembly and the structure of a gradient coil assembly.
Figure 4B:
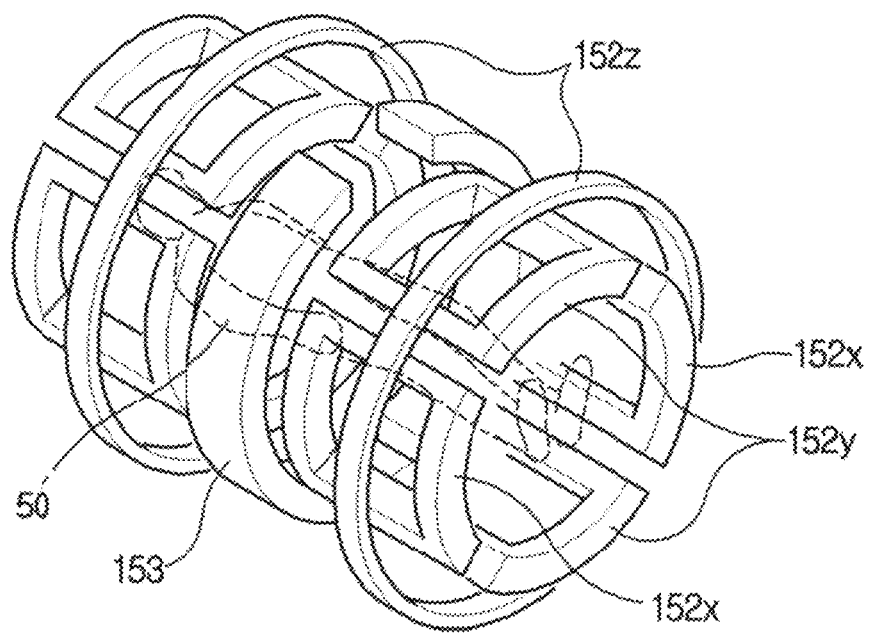

As shown in FIGS. 4A and 4B, Z-axis gradient coils 152z are ring type coils, Y-axis gradient coils 152y are disposed above and below the object 50, and X-axis gradient coils 152x are disposed on the left and right of the object 50.

The axis gradient coils 152z are used in slice selection, the Y-axis gradient coils 152y are used in phase encoding, and X-axis gradient coils 152x are used in frequency encoding.

FIG. 5 is a view showing a pulse sequence related to operation of the gradient coils.

When direct currents having opposite poles flow in two Z-axis gradient coils 152z in opposite directions, a magnetic field is changed in Z-axis direction to generate a gradient field.

When current flows in the Z-axis gradient coils 152z for a predetermined time to generate a gradient field, a resonance frequency is greatly or slightly changed according to the magnitude of the gradient field. When a high frequency corresponding to a specific position is generated by the RF coil assembly 153, only a proton of a section corresponding to the specific position resonates. For example, the axis gradient coils 152z are used in slice selection. The greater the Z-axis magnetic field gradient is, the smaller thickness of the selected slice is.

When a slice is selected through the gradient field generated by the Z-axis gradient coils 152z, spins constituting the slice have the same frequency and phase. For this reason, the spins may not be distinguished from each other.

At this time, when a gradient field is generated by the Y-axis gradient coils 152y in the Y-axis direction, the gradient field causes phase shift so that rows of the slice have different phases.

That is, when the Y-axis gradient field is generated, the phase of the spins of the row to which the large gradient field is applied is changed into high frequency and the phase of the spins of the row to which the small gradient field is applied is changed into low frequency. When the Y-axis gradient field disappears, the respective rows of the selected slice have different phases through phase shift. For example, the spins may be distinguished from each other. In this way, the gradient field generated by the Y-axis gradient coils 152y is used in phase encoding.

The slice is selected through the gradient field generated by the Z-axis gradient coils 152z and the rows constituting the slice selected through the gradient field generated by the Y-axis gradient coils 152y are distinguished from each other as different phases. However, spins constituting the rows have the same frequency and phase. For this reason, the spins may not be distinguished from each other.

At this time, when a gradient field is generated by the X-axis gradient coils 152x in the X-axis direction, the X-axis gradient field enables the spins constituting the respective rows to have different frequencies so that the spins are distinguished from each other. In this way, the gradient field generated by the X-axis gradient coils 152x is used in frequency encoding.

As described above, the gradient fields generated by the Z, Y, and X-axis gradient coils encode spatial position of the respective spins through slice selection, phase encoding, and frequency encoding.

The gradient coil assembly 152 is connected to the gradient controller 130. The gradient controller 130 applies a gradient pulse, i.e., a current pulse, to the gradient coil assembly 152 according to a control signal received from the magnet assembly controller 121 to generate a gradient field. For example, the gradient controller 130 may be a gradient power source. The gradient controller 130 may include three drive circuits corresponding to the three gradient coil pairs 152x, 152y, and 152z constituting the gradient coil assembly 152.

As described above, atomic nuclei arranged by an external static magnetic field perform precession at a Larmor frequency. The magnetization vector sum of several atomic nuclei may be represented by single net magnetization M.

A Z-axis component of the net magnetization cannot be measured, and only traverse magnetization $M_{xy}$ may be detected. Consequently, the net magnetization may be present on an XY plane to obtain an MR signal. To excite atomic nuclei, an RF pulse tuned to a Larmor frequency of atomic nuclei may be applied to a static magnetic field.

The RF coil assembly 153 includes a transmit coil to transmit an RF pulse and a receipt coil to receive an electromagnetic wave emitted from the excited atomic nuclei, i.e., an MR signal. Alternatively, the RF coil assembly 153 may include a combined transmit and receipt coil, instead of separate transmit and receipt coils.

The RF coil assembly 153 is connected to the RF transmitter 140. The RF transmitter 140 applies a high-frequency signal to the RF coil assembly 153 according to a control signal received from the magnet assembly controller 121 so that the RF coil assembly 153 transmits an RF pulse into the magnet assembly 150.

The RF transmitter 140 may include a modulation circuit to modulate a high-frequency signal into a pulse signal and an RF power amplifier to amplify the pulse signal.

A spin echo pulse sequence is mainly used to obtain an MR signal from atomic nuclei. The spin echo pulse sequence will hereinafter be described in detail.

Figure 6:
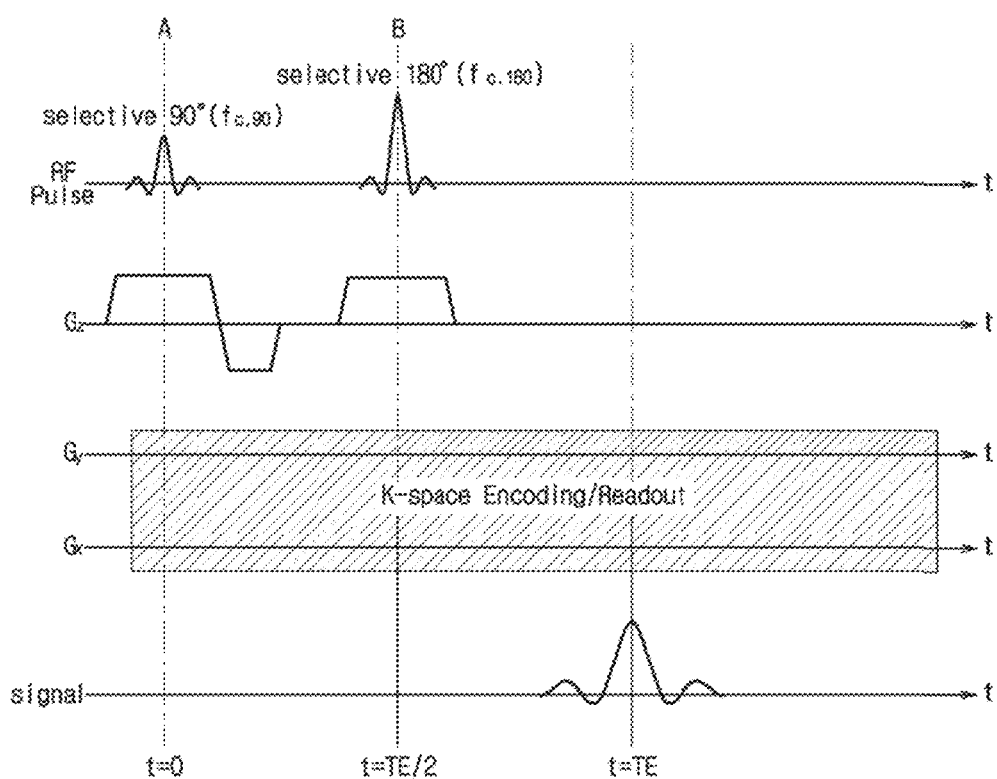
FIG. 6 is a pulse sequence diagram in a case in which a spin echo pulse sequence is used.

FIG. 6 is a pulse sequence diagram in a case in which the spin echo pulse sequence is used.

When the RF coil assembly 153 applies an RF pulse, an RF pulse to excite atomic nuclei (hereinafter, referred to as an RF excitation signal) is first applied. When the RF excitation signal is applied, dephasing is caused due to inhomogeneity of a magnetic field or interaction between spins. As a result, abruptly reduced free induction decay (FID) signal is generated and an RF refocusing signal for recollection of dephased spins is applied to obtain a stable signal. Therefore, the FID signal is recollected to generate a stable echo signal, i.e., an MR signal. This is referred to as a spin echo pulse sequence. Time taken until an MR signal is generated after application of the RF excitation signal is referred to as time echo (TE).

On the assumption that time when the RF refocusing signal is applied after application of the RF excitation signal is Δt, an MR signal is generated when the time Δt elapses after application of the RF refocusing signal. Consequently, TE=2Δt.

To what extent a proton has been flipped may be indicated by an angle moved from an axis at which the proton had been located before flip. A 90° RF or a 180° RF appears depending upon a flip degree. In the spin echo pulse sequence, the RF excitation signal is referred to as a 90° RF pulse or signal and the RF refocusing signal is referred to as a 180° RF pulse or signal.

Referring to FIG. 6, when a 90° RF pulse and a 180° RF pulse are applied, a gradient current is applied to the Z-axis gradient coils 152z to generate a Z-axis magnetic field gradient Gz to select a specific slice. As shown in FIG. 6, the gradient current is applied in a pulse form. In addition, a Y-axis magnetic field gradient Gy is generated and used in phase encoding and an X-axis magnetic field gradient Gx is generated and used in frequency encoding or readout. Signals generated by the Y-axis gradient field and the X-axis gradient field fill a k-space.

The MRI apparatus 100 performs MRI using CMT technique. As distance from the isocenter of the magnetic field generated in the bore is increased, uniformity of the magnetic field is reduced. For this reason, MR data are acquired at a position nearest the isocenter to minimize distortion of an image. The isocenter is the center of the magnetic field generated in the bore where the magnitudes of the X-axis magnetic field gradient Gx, the Y-axis magnetic field gradient Gy, and the Z-axis magnetic field gradient Gz are 0.

In the CMT technique, the table is continuously moved during MRI so that a portion of an object to be imaged is located on the isocenter. When the CMT technique is applied, a uniform image may be obtained without acquisition of addition data, such as shimming, or correction of the acquired data.

Figure 7A:
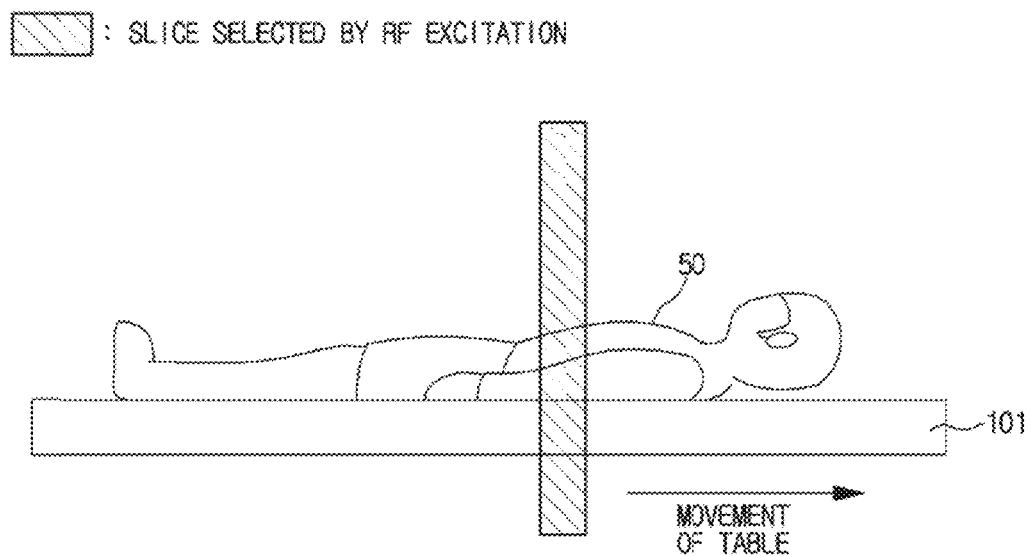
FIGS. 7A and 7B are views schematically showing inconformity between slice regions caused by movement of a table.
Figure 7B:
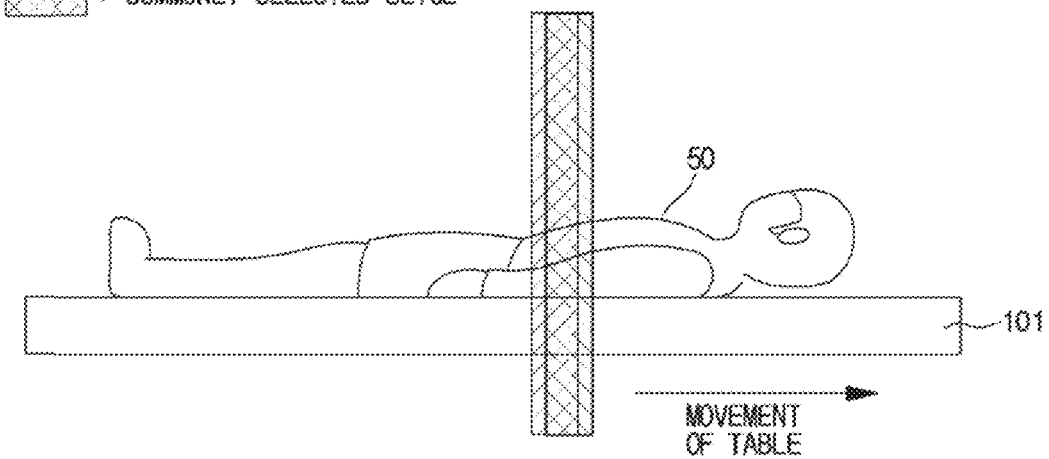

FIGS. 7A and 7B are views schematically showing inconformity between slice regions generated by movement of the table.

As shown in FIG. 7A, when the patient table 101, on which the object 50 is lying, is inserted into the bore so that the object 50 is located in a magnetic field, an RF excitation signal is applied to select a specific slice, which is a target to be imaged.

An RF refocusing signal is applied after the lapse of TE/2. At this time, when an RF refocusing signal having the same frequency as the RF excitation signal is applied, a slice selected by the RF excitation signal RF excitation signal and a slice selected by the RF refocusing signal may not conform to each other as shown in FIG. 7B.

This is because, when the patient table 101 is moved, the slice selected by the RF excitation signal is also moved, as described in greater detail below with reference to FIG. 8.

Figure 8:
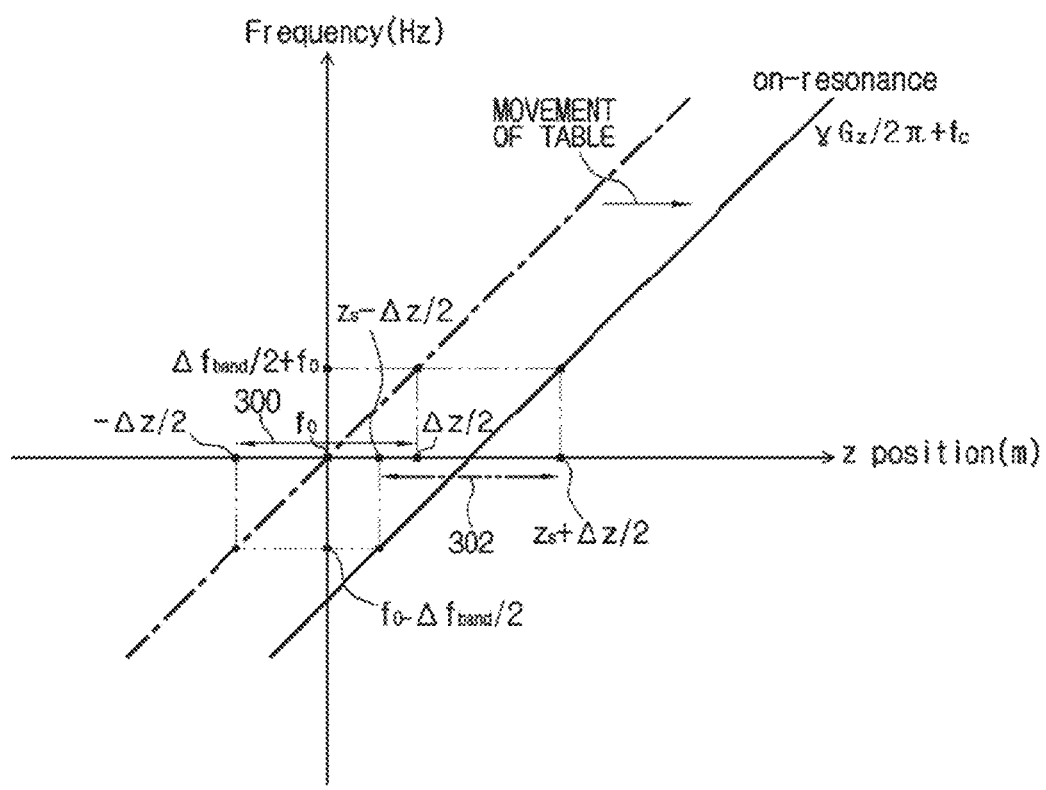
FIG. 8 is a graph showing inconformity between slice regions caused by movement of the table.

FIG. 8 is a graph showing inconformity between slice regions caused by movement of the table. In the following example, a slice selected by the RF excitation signal is a slice having atomic nuclei excited by the RF excitation signal and a slice selected by the RF refocusing signal is a slice having atomic nuclei refocused by the RF refocusing signal.

Referring to FIG. 8, the horizontal axis indicates the Z axis parallel to the longitudinal direction of the magnet assembly 150. On the assumption that the object 50 is lying on the Z axis, the position on the Z axis may indicate the position of a slice. The vertical axis indicates a frequency. A straight line having a gradient indicates a resonance frequency ($f_c + \gamma G_z/2\pi$) per position on the Z axis. Here, $G_z$ is the magnitude of a Z-axis magnetic field gradient at a specific position and $f_c$ is a resonance frequency on the isocenter, i.e., a center frequency of the magnetic field generated in the bore.

In FIG. 8, a point where the Z-axis magnetic field gradient is 0 is a reference point of the position on the Z axis, i.e., 0, and a unit of the distance between positions is meter (m).

As shown in FIG. 8, when an RF excitation signal having a center frequency $f_0$ and a band width $\Delta f_{band}$ is applied to select a slice 300 located between $-\Delta z/2$ and $\Delta z/2$, an RF refocusing signal may be applied when time TE/2 elapses after application of the RF excitation signal to obtain an MR signal from the selected slice. Here, $f_0$ is a frequency on the isocenter.

Since the MRI apparatus 100 performs imaging while moving the patient table 101, the patient table 101 is moved until the RF refocusing signal is applied after application of the RF excitation signal. As a result, the slice 300 initially selected by the RF excitation signal is no more located between $-\Delta z/2$ and $\Delta z/2$.

As shown in FIG. 8, when the patient table 101 is moved on the Z axis in the positive (+) direction, the slice 300 selected by the RF excitation signal is moved in the positive direction by the movement distance of the patient table 101 and is now located between $z_s - \Delta z/2$ and $z_s + \Delta z/2$ (reference numeral 302). Here, $z_s$ is the movement distance of the patient table 101 until the refocusing signal is applied and $\Delta z$ is a thickness of the slice.

When an RF refocusing signal having the same frequency as the RF excitation signal is applied without considering the movement of the patient table 101, a slice region selected by the RF refocusing signal is between $-\Delta z/2$ and $\Delta z/2$.

A commonly selected region between the slice selected by the RF excitation signal and the slice selected by the RF refocusing signal is between $z_s - \Delta z/2$ and $\Delta z/2$. An echo signal is generated at the commonly selected region. Since the original slice region, from which the MR signal is to be acquired, is between $z_s - \Delta z/2$ and $z_s + \Delta z/2$ at the time of application of the RF refocusing signal, an echo signal for a slice having a smaller thickness than the intended slice may be obtained. As a result, a signal to noise ratio (SNR) of an image signal may be reduced.

When the movement speed of the patient table 101 is fast, no commonly selected region may be provided between the slice region selected by the RF excitation signal and the slice region selected by the RF refocusing signal. In this case, an MR signal for the intended slice may not be obtained.

For example, the MRI apparatus 100 of an exemplary embodiment applies an RF refocusing signal considering movement of the patient table 101.

Figure 9A:
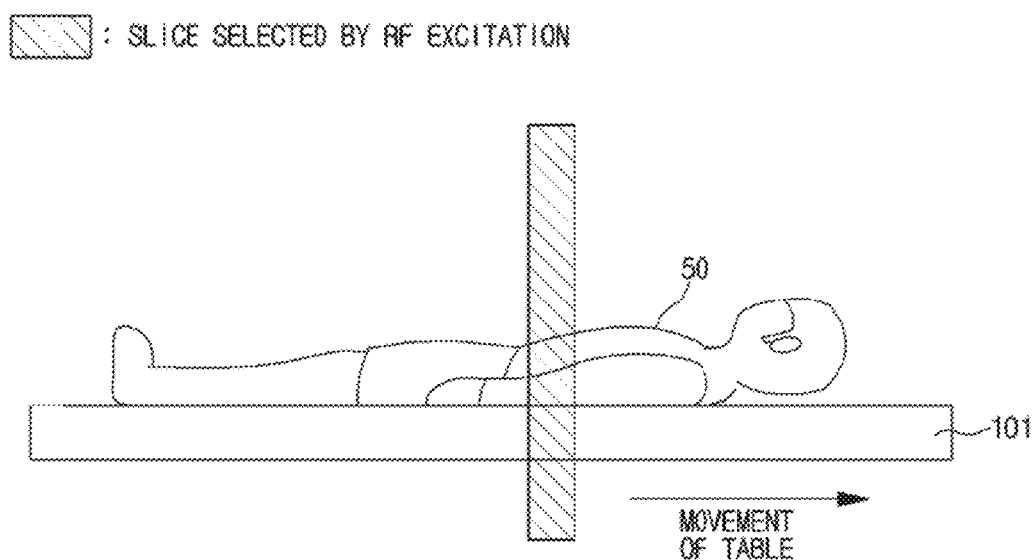
FIGS. 9A and 9B are views schematically showing conformity between slice regions achieved by the MRI apparatus according to the exemplary embodiment.
Figure 9B:
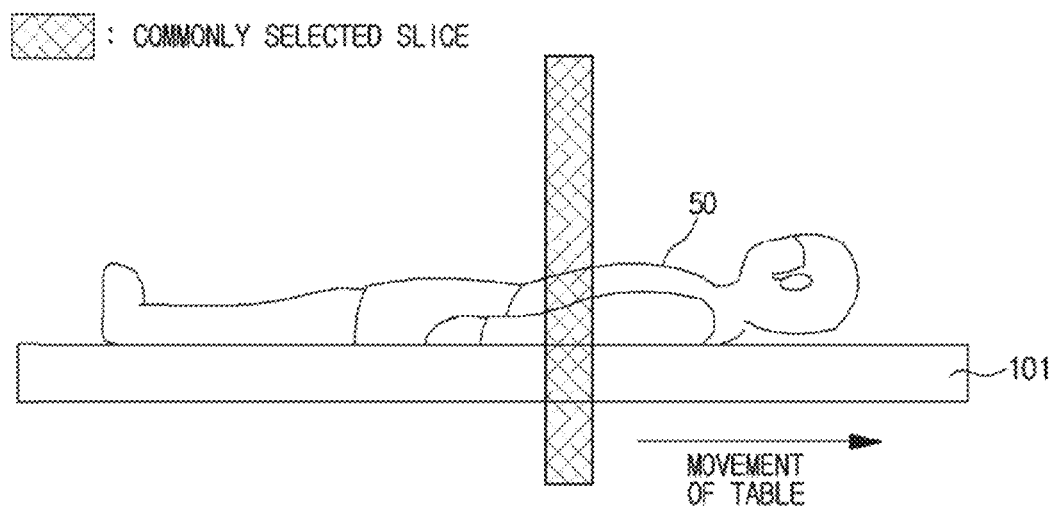

FIGS. 9A and 9B are views schematically showing conformity between slice regions achieved by the MRI apparatus according to the exemplary embodiment.

As shown in FIG. 9A, when the patient table 101, on which the object 50 is lying, is inserted into the bore so that the object 50 is located in a magnetic field, an RF excitation signal corresponding to a specific slice, which is a target to be imaged, is applied.

An RF refocusing signal is applied after the lapse of TE/2. As described above, the slice selected by the RF excitation signal is also moved when the patient table 101 is moved. As shown in FIG. 9B, therefore, the MRI apparatus 100 applies an RF refocusing signal shifted based on the movement of the patient table 101.

Since refocusing RF selects the slice selected by the RF excitation signal, the slice selected by the RF refocusing signal and the slice selected by the RF excitation signal conform to each other, thereby preventing reduction of a SNR due to inconformity between the slices.

Figure 10:
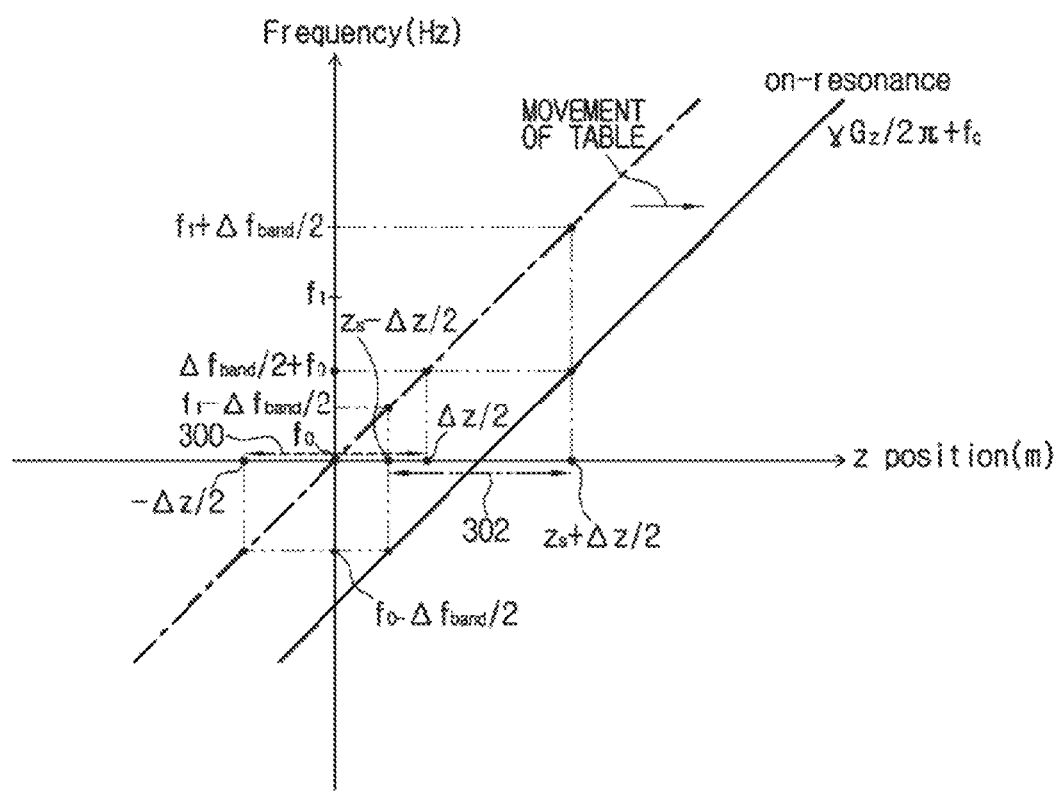
FIG. 10 is a graph showing conformity between slice regions achieved by the MRI apparatus according to the exemplary embodiment.

FIG. 10 is a graph showing conformity between slice regions achieved by the MRI apparatus according to the exemplary embodiment.

Referring to FIG. 10, the position of the slice 300 selected by the RF excitation signal is changed from between $-\Delta z/2$ and $\Delta z/2$ to a region 302 between $z_s - \Delta z/2$ and $z_s + \Delta z/2$ according to movement of the patient table 101. For example, an RF refocusing signal may be applied to select a slice having a same region 302 between $z_s - \Delta z/2$ and $z_s + \Delta z/2$ in order to achieve conformity between the slice selected by the RF excitation signal and the slice selected by the RF refocusing signal.

That is, the RF coil assembly 153 may apply an RF refocusing signal having a center frequency shifted to $f_1$. The magnet assembly controller 121 calculates the center frequency of the RF refocusing signal based on the movement speed of the patient table 101.

The center frequency of the RF is the center frequency of the RF applied by the RF coil assembly 153, which corresponds to a resonance frequency of atomic nuclei present at the center of a slice to be selected. For example, the center frequency of the RF is different in meaning from the center frequency of the magnetic field generated in the bore, i.e., the frequency $f_c$ on the isocenter.

The relationship between the resonance frequency f and the magnitude B of an external magnetic field may be derived from Equation 1 as follows:

$$f = \gamma B/2\pi \qquad \text{[Equation 2]}$$

Equation 3 regarding a variation of the resonance frequency and a variation of the magnetic field may be derived from Equation 2 as follows:

$$\Delta f = \gamma \Delta B/2\pi \qquad \text{[Equation 3]}$$

On the assumption that a variation of the Z-axis magnetic field gradient per unit of distance is $g_z$, Equation 3 may be represented by Equation 4 as follows:

$$\Delta f = \gamma g_z \Delta d/2\pi, \qquad \text{[Equation 4]}$$

where $\Delta d$ is a movement distance of the table on the Z axis.

When the patient table 101 is moved at a uniform speed V m/s, the movement distance for the patient table 101 is equal to $V \times (TE/2)$ until the RF refocusing signal is applied after application of the RF excitation signal. Here, TE is a time echo.

The center frequency offset $f_{offset}$ for the RF refocusing signal may be represented by Equation 5 as follows:

$$f_{offset}=\Delta f=\gamma g_z V(TE)/4\pi \quad \text{[Equation 5]}$$

The magnet assembly controller 121 calculates offset of the center frequency according to Equation 5 and calculates the frequency shifted by the offset calculated from the center frequency of the RF excitation signal as the center frequency of the RF refocusing signal. The magnet assembly controller 121 controls the RF coil assembly 153 to apply the RF refocusing signal according to the shifted center frequency. The bandwidth of the RF refocusing signal may be equal to that of the RF excitation signal.

Referring back to FIG. 10, the center frequency $f_1$ of the RF refocusing signal has a value shifted from the center frequency $f_0$ of the RF excitation signal by $f_{offset}$. When an RF refocusing signal having a center frequency $f_1$ and a bandwidth $\Delta f$ is applied, a slice having a region between $z_s-\Delta z/2$ and $z_s+\Delta z/2$ is selected.

Figure 11:
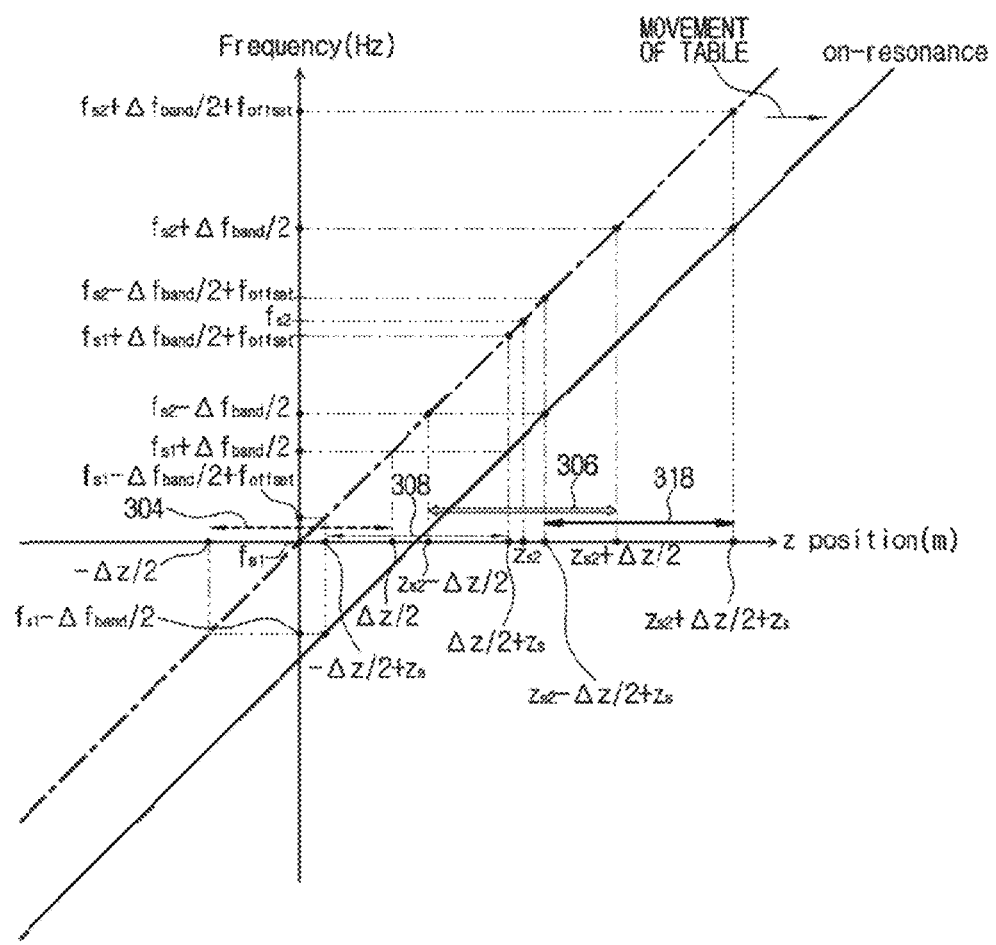
FIG. 11 is a graph showing change in position of multiple slices according to movement of the table.

FIG. 11 is a graph showing change in position of multiple slices according to movement of the table.

The MRI apparatus 100 may obtain magnetic resonance images for multiple slices. For example, multiple slices may be simultaneously scanned.

As shown in FIG. 11, slices have different resonance frequency ranges. For example, the magnet assembly controller 121 may control the RF coil assembly 153 to apply an RF corresponding to each slice.

As shown in FIG. 11, when a first slice 304 is located between $-\Delta z/2$ and $\Delta z/2$ and a second slice 306 is located between $z_{s2}-\Delta z/2$ and $z_{s2}+\Delta z/2$, the center frequency of an RF excitation signal for the first slice is $f_{s1}$ and the center frequency of an RF excitation signal for the second slice is $f_{s2}$. As the patient table 101 is moved, the first slice selected by the RF excitation signal is moved to a region 308 between $z_s-\Delta z/2$ and $z_s+\Delta z/2$ and the second slice selected by the RF excitation signal is moved to a region 318 between $z_{s2}-\Delta z/2+z_s$ and $z_{s2}+\Delta z/2+z_s$. Here, $f_{s1}$ may be fc.

In order to achieve conformity between the slice selected by the RF excitation signal and a slice to be selected by an RF refocusing signal for each slice, the RF refocusing signal for the first slice has a center frequency shifted from $f_{s1}$ by $f_{offset}$ as calculated above and the RF refocusing signal for the second slice has a center frequency shifted from $f_{s2}$ by $f_{offset}$.

In FIG. 11, two slices are shown for the convenience of description. However, the same principle is applied to three or more slices. That is, the MRI apparatus 100 may apply an RF refocusing signal shifted from an RF excitation signal by an offset proportional to the movement distance of the patient table 101 irrespective of the number of slices to achieve conformity between a slice selected by the RF excitation signal and a slice selected by the RF refocusing signal.

In FIG. 11, MR signals for multiple slices are simultaneously acquired. However, the MRI apparatus 100 may acquire MR signals for multiple slices sequentially or in an interleaving fashion.

When the MR signals for the multiple slices are acquired sequentially or in the interleaving fashion, a time interval is present between acquisition of an MR signal for the previous slice and acquisition of an MR signal for the next slice and the patient table 101 is moved for the time interval. For example, the offset of the center frequency based on the movement distance of the patient table 101 may be calculated as described above and the calculate offset may be additionally applied whenever advance to the next slice is performed. The previous slice and the next slice are based on the acquisition order of MR signals, not physical positions. The center frequencies of the RF excitation signal and the RF refocusing signal may be adjusted to select the acquisition order of multiple slices.

Specifically, movement of the patient table 101 is also considered between application of the RF refocusing signal to the previous slice and application of the RF excitation signal to the next slice. Referring back to FIG. 11, the center frequency of the RF excitation signal of the second slice may be a value shifted from $f_{s2}$ by $f_{offset1}+f_{offset2}$. $f_{offset1}$ is a frequency offset according to movement of the patient table 101 for TE/2 and $f_{offset2}$ is a frequency offset according to movement of the patient table 101 until the RF excitation signal of the second slice is applied after application of the RF refocusing signal of the first slice.

The center frequency of the RF refocusing signal of the second slice has a value shifted from the center frequency of the RF excitation signal of the second slice by $f_{offset}$.

Figure 12:
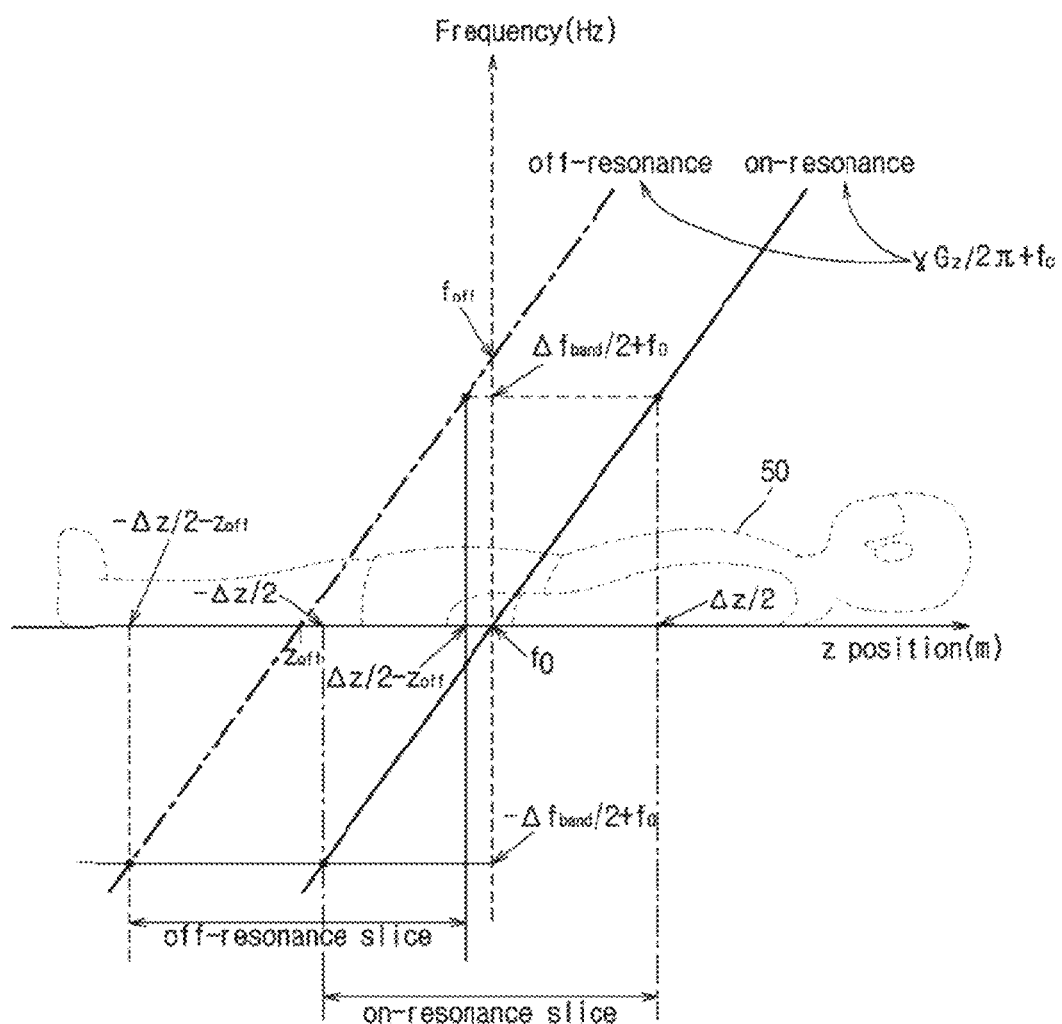
FIG. 12 is a graph showing an off-resonance component and an on-resonance component generating an MR signal when a radio frequency (RF) pulse is applied to an object.

FIG. 12 is a graph showing an off-resonance component and an on-resonance component generating an MR signal when an RF is applied to the object.

Precession frequencies differ depending upon whether hydrogen atoms constitute a fat layer or muscle even when the object is located in magnetic fields having the same magnitude. Generally, a precession frequency of the hydrogen atoms constituting the fat layer is lower than that of the hydrogen atoms constituting other organs. When the RF is applied, as shown in FIG. 12, an MR signal may also be generated at a region other than a slice intended by a user due to an off-resonance component.

Referring to FIG. 12, for an on-resonance component having the same resonance frequency as the RF excitation signal and the RF refocusing signal, an MR signal is generated at a slice located between $-\Delta z/2$ and $\Delta z/2$. For an off-resonance component having an offset frequency $f_{off}$, an MR signal is generated at a slice located between $-\Delta z/2+z_{off}$ and $\Delta z/2+z_{off}$.

The slice located between $-\Delta z/2+z_{off}$ and $\Delta z/2+z_{off}$ is not a region intended by the user. For example, the MRI apparatus 100 may reverse the polarity of the Z-axis magnetic field gradient when the RF refocusing signal is applied so that the polarity of the Z-axis magnetic field gradient when the RF refocusing signal is applied is opposite to that of the Z-axis magnetic field gradient when the RF excitation signal is applied to obtain an MR signal for a slice intended by the user in consideration of the off-resonance component. That is, a positive magnetic field gradient Gz is applied when the RF excitation signal is applied, and a negative magnetic field gradient -Gz is applied when the RF refocusing signal is applied. This is called gradient reversal technique.

Figure 13:
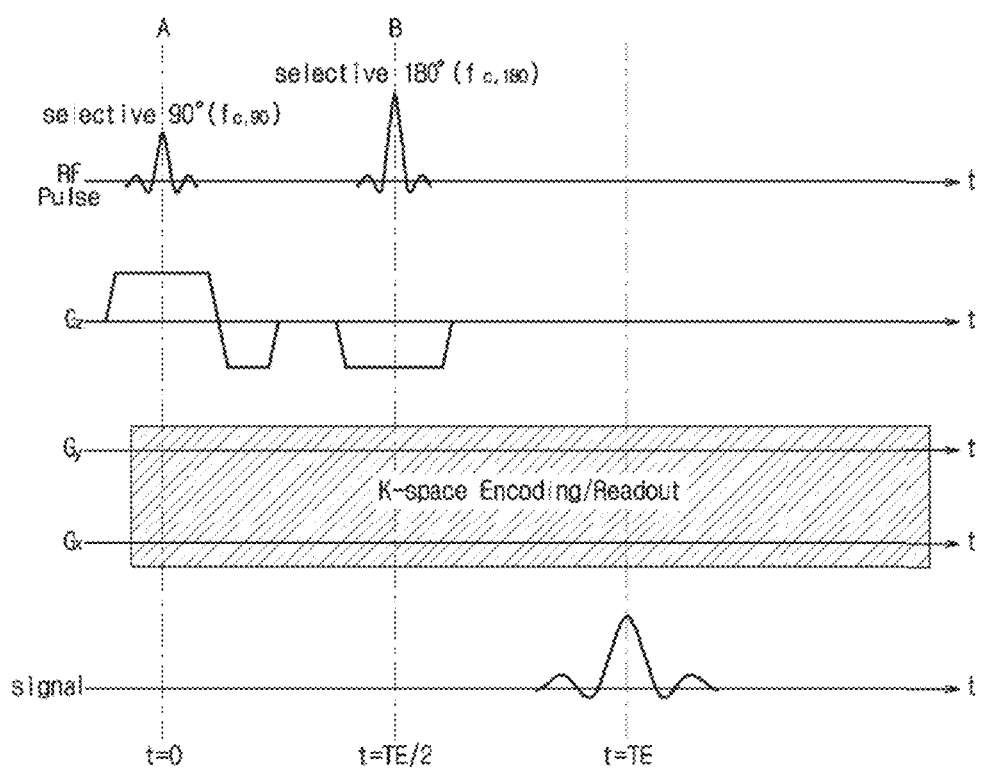
FIG. 13 is a pulse sequence diagram used in gradient reversal technique.
Figure 14:
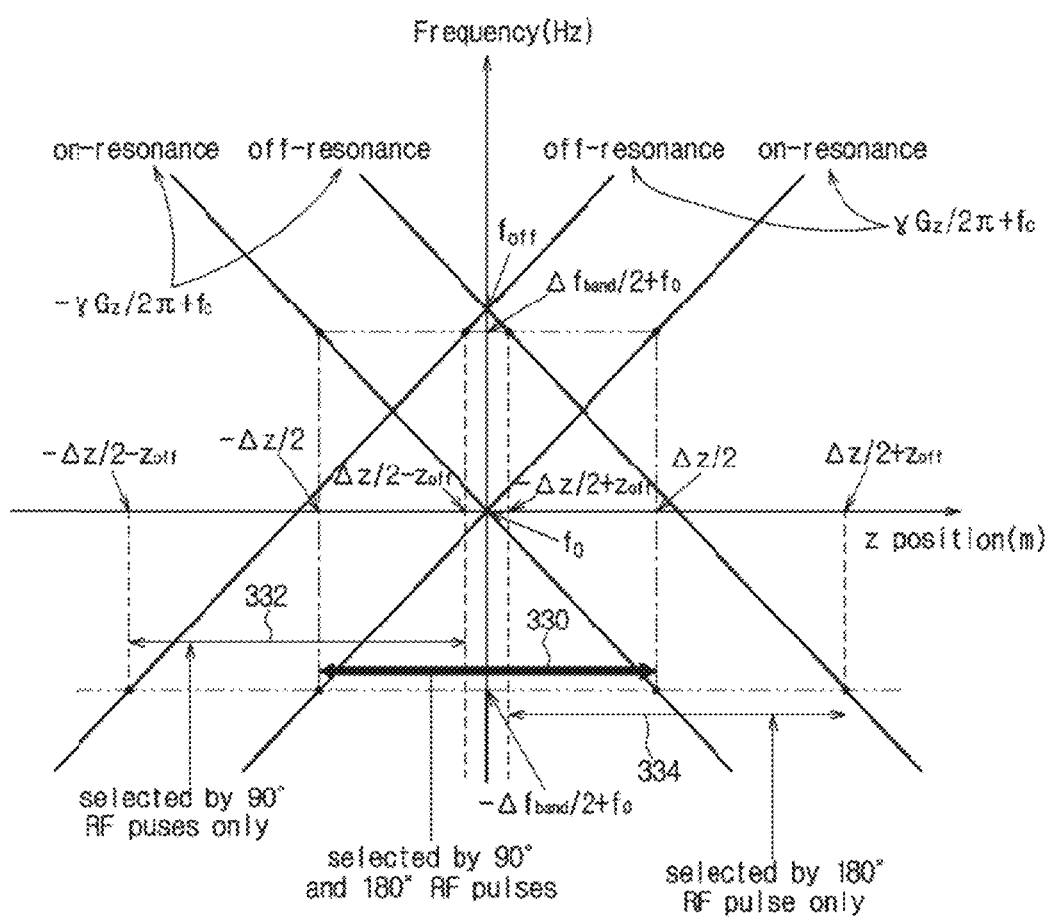
FIG. 14 is a graph showing the position of a slice generating an MR signal when a pulse according to FIG. 13 is generated.

FIG. 13 is a pulse sequence diagram used in gradient reversal technique and FIG. 14 is a graph showing the position of a slice generating an MR signal when a pulse according to FIG. 13 is generated.

Referring to FIG. 13, the magnet assembly controller 121 reverses the direction, i.e., a polarity of the Z-axis magnetic field gradient when the RF refocusing signal is applied (hereinafter, a refocusing gradient field) so that the polarity of the Z-axis magnetic field gradient when the RF refocusing signal is applied is opposite to that of the Z-axis magnetic field gradient when the RF excitation signal is applied (hereinafter, an excitation gradient field). In this case, the position of a slice as shown in FIG. 14 is selected.

Referring to FIG. 14, a slice 330 selected by the on-resonance component when the RF excitation signal is applied is located between $-\Delta z/2$ and $\Delta z/2$ and a slice 332 selected by the off-resonance component when the RF excitation signal is applied is located between $\Delta z/2-z_{off}$ and $\Delta z/2-z_{off}$. A slice 330 selected by the on-resonance component when the RF refocusing signal is applied is located between $-\Delta z/2$ and $\Delta z/2$ and a slice 334 selected by the off-resonance component when the RF refocusing signal is applied is located between $-\Delta z/2+z_{off}$ and $\Delta z/2+z_{off}$.

Consequently, the slice 330 commonly selected when the RF excitation signal is applied and when the RF refocusing signal is applied is located between $-\Delta z/2$ and $\Delta z/2$. For example, the final region generating an MR signal includes only the on-resonance component and the off-resonance component does not affect the generated signal. As a result, the MR signal may be generated only for a slice region intended by the user.

Figure 15:
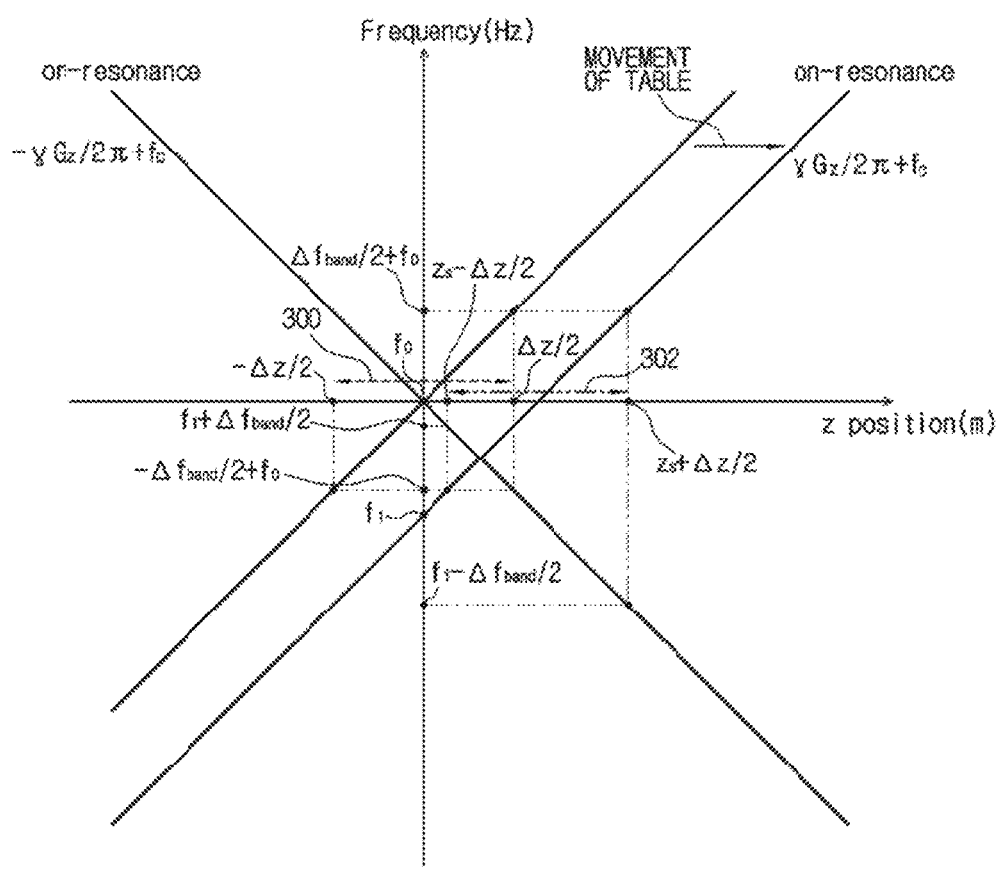
FIG. 15 is a graph showing inconformity between slice regions caused by movement of the table when the gradient reversal technique is applied.

FIG. 15 is a graph showing inconformity between slice regions caused by movement of the table when the gradient reversal technique is applied.

As described above, the position of a slice selected by an RF excitation signal is changed according to movement of the patient table 101. For example, an RF refocusing signal shifted by a predetermined value according to movement of the patient table 101 may be applied. At this time, the polarity of a gradient signal applied together with the RF refocusing signal is opposite to that of a gradient signal applied together with the RF excitation signal. As a result, center frequencies of the RF excitation signal and the RF refocusing signal have opposite offsets.

When Equation 4 is used, the center frequency of the RF refocusing signal is shifted from that of the RF excitation signal by $f_{offset} = \gamma g_z \Delta d/2\pi r$.

Referring to FIG. 15, a slice 300 selected by an RF excitation signal is located between $-\Delta z/2$ and $\Delta z/2$ and the position of the slice is moved to a region 302 between $-\Delta z/2+zs$ and $\Delta z/2+zs$ according to movement of the patient table 101. An RF refocusing signal applied together with a gradient signal having opposite polarity has a center frequency $f_1$ and a uniform bandwidth $\Delta f_{band}$. Here, $f_1$ is a value shifted from the center frequency $f_0$ of the RF excitation signal by $-\gamma g_z \Delta d/2\pi$. $f_0$ may be fc.

Figure 16:
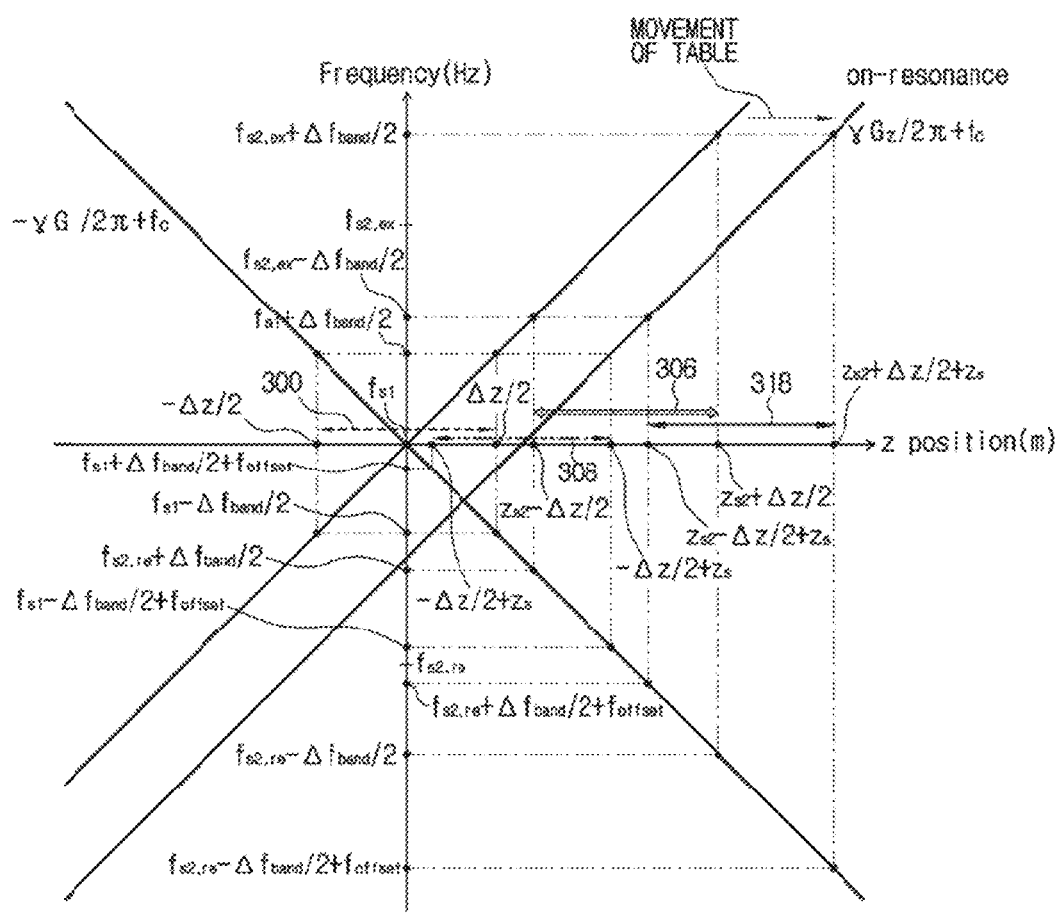
FIG. 16 is a graph showing an offset of an RF refocusing signal according to movement of the table when the gradient reversal technique is applied.

FIG. 16 is a graph showing an offset of an RF refocusing signal according to movement of the table when the gradient reversal technique is applied to acquire MR signals for multiple slices. In FIG. 16, when movement of the patient table 101 is not considered, a center frequency corresponding to a first slice is $f_{s1}$ and center frequencies corresponding to a second slice are $f_{s2,ex}$ and $f_{s2,re}$. $f_{s1}$ may be fc.

Even when the gradient reversal technique is applied, the MRI apparatus 100 may adaptively control the RF refocusing signal to perform MRI for multiple slices. To this end, the RF refocusing signal for the second slice may be adjusted based on the gradient reversal technique. In this example, the first slice and the second slice may be simultaneously acquired.

The center frequency of the RF refocusing signal for the first slice has a value shifted from the center frequency $f_{s1}$ of the RF excitation signal by $f_{offset} = -\gamma g_z \Delta d/2\pi r$.

For the second slice, in a case in which a magnetic field gradient Gz is applied when an RF excitation signal is applied and a magnetic field gradient $-Gz$ is applied when an RF refocusing signal is applied, a resonance frequency range corresponding to the second slice is changed even when the patient table 101 is not moved.

Specifically, referring to FIG. 16, the resonance frequency corresponding to the second slice when the RF excitation signal is applied has a range of $f_{s2,ex}+\Delta f_{band}/2$ to $f_{s2,ex}-\Delta f_{band}/2$, whereas the resonance frequency corresponding to the second slice when the RF refocusing signal is applied has a range of $f_{s2,re}+\Delta f_{band}/2$ to $f_{s2,re}-\Delta f_{band}/2$. Here, $f_{s2,ex}$ is a value shifted from $f_{s1}$ by $f_s$, i.e., $f_{s2,ex}=f_{s1}+f_s$, and $f_{s2,re}$ is a value shifted from $f_{s1}$ by $-f_s$, i.e., $f_{s2,re}=f_{s1}-f_s$. $f_s$ is an offset according to slice selection. The size of $f_s$ may be adjusted to adjust a gap between the slices.

In order to obtain an MR signal for the second slice, an RF excitation signal having a range of $f_{s2,ex}+\Delta f_{band}/2$ to $f_{s2,ex}-\Delta f_{band}/2$ may be applied and an RF refocusing signal having a range of $f_{s2,re}+\Delta f_{band}/2$ to $f_{s2,re}-\Delta f_{band}/2$ may be applied. That is, in a case in which MR signals for multiple slices are acquired using the gradient reversal technique, the RF refocusing signal and the RF excitation signal for the second slice may have different ranges even when the patient table 101 is not moved.

A case in which the patient table 101 is moved will be described. Referring to FIG. 16, RF excitation signals having $f_{s1}$ and $f_{s2,ex}$ as center frequencies are simultaneously applied to the first slice 304 located between $-\Delta z/2$ and $\Delta z/2$ and the second slice 306 located between $z_{s2}-\Delta z/2$ and $z_{s2}+\Delta z/2$. According to movement of the patient table 101, the first slice and the second slice selected by the RF excitation signals are located between $z_s-\Delta z/2$ and $z_s+\Delta z/2$ (reference numeral 308) and between $z_{s2}-\Delta z/2+z_s$ and $z_{s2}+\Delta z/2+z_s$ (reference numeral 318) at the time of application of RF refocusing signals, i.e., when TE/2 elapses after application of the RF excitation signals.

In order to select the slice located between $z_s-\Delta z/2$ and $z_s+\Delta z/2$ by the RF refocusing signal as the first slice, an RF refocusing signal having a center frequency shifted from the center frequency of the RF excitation signal by $f_{offset}$ may be applied as described above.

In a case in which the patient table 101 has not been moved, an RF refocusing signal having a center frequency $f_{s2,re}$, i.e., an RF refocusing signal having a range of $f_{s2,re}+\Delta f_{band}/2$ to $f_{s2,re}-\Delta f_{band}/2$, may be applied to the second slice. Since the patient table 101 has been moved in this embodiment, an RF refocusing signal having a range of $f_{s2,re}+\Delta f_{band}/2+f_{offset}$ to $f_{s2,re}-\Delta f_{band}/2+f_{offset}$ may be applied to the second slice.

In FIG. 16, two slices are illustrated as scanned for the convenience of description. However, the number of slices is not limited. When a center frequency offset based on movement distance of the patient table 101 is applied to each slice, conformity between the slice selected by the RF excitation signal and the slice selected by the RF refocusing signal may be achieved.

In an exemplary embodiment, the spins of the hydrogen atoms constituting the fat layer are set as the off-resonance component. However, the spins of the hydrogen atoms constituting the fat layer may be set as the on-resonance component. When a region to be detected is set as the on-resonance component, only an MR signal for the region may be detected.

In FIG. 16, MR signals for multiple slices are simultaneously acquired. However, the MRI apparatus 100 may acquire MR signals for multiple slices sequentially or in an interleaving fashion even when the gradient reversal technique is applied.

When the MR signals for the multiple slices are acquired sequentially or in the interleaving fashion, a time interval is present between acquisition of an MR signal for the previous slice and acquisition of an MR signal for the next slice and the patient table 101 is moved for the time interval. For example, the offset of the center frequency based on the movement distance of the patient table 101 may be calculated as described above and the calculated offset may be additionally applied whenever advance to the next slice is performed.

Specifically, movement of the patient table 101 is also considered between application of the RF refocusing signal to the previous slice and application of the RF excitation signal to the next slice. Referring back to FIG. 16, the center frequency of the RF excitation signal of the second slice may be a value shifted from $f_{s2,ex}$ by $f_{offset1}+f_{offset2}$. $f_{offset1}$ is a frequency offset according to movement of the patient table 101 for TE/2 and $f_{offset2}$ is a frequency offset according to movement of the patient table 101 until the RF excitation signal of the second slice is applied after application of the RF refocusing signal of the first slice.

The center frequency of the RF refocusing signal of the second slice has a value shifted from the center frequency of the RF excitation signal of the second slice by $f_{offset}$.

In addition, the MRI apparatus 100 may use a multi echo sequence. The multi echo sequence is technique of applying a plurality of RF refocusing signals after application of an RF excitation signal to acquire a plurality of echo signals using one RF excitation signal. When the multi echo sequence is applied, the center frequency of each refocusing RF may be shifted according to movement distance of the patient table 101 whenever each refocusing RF is applied.

Figure 17:
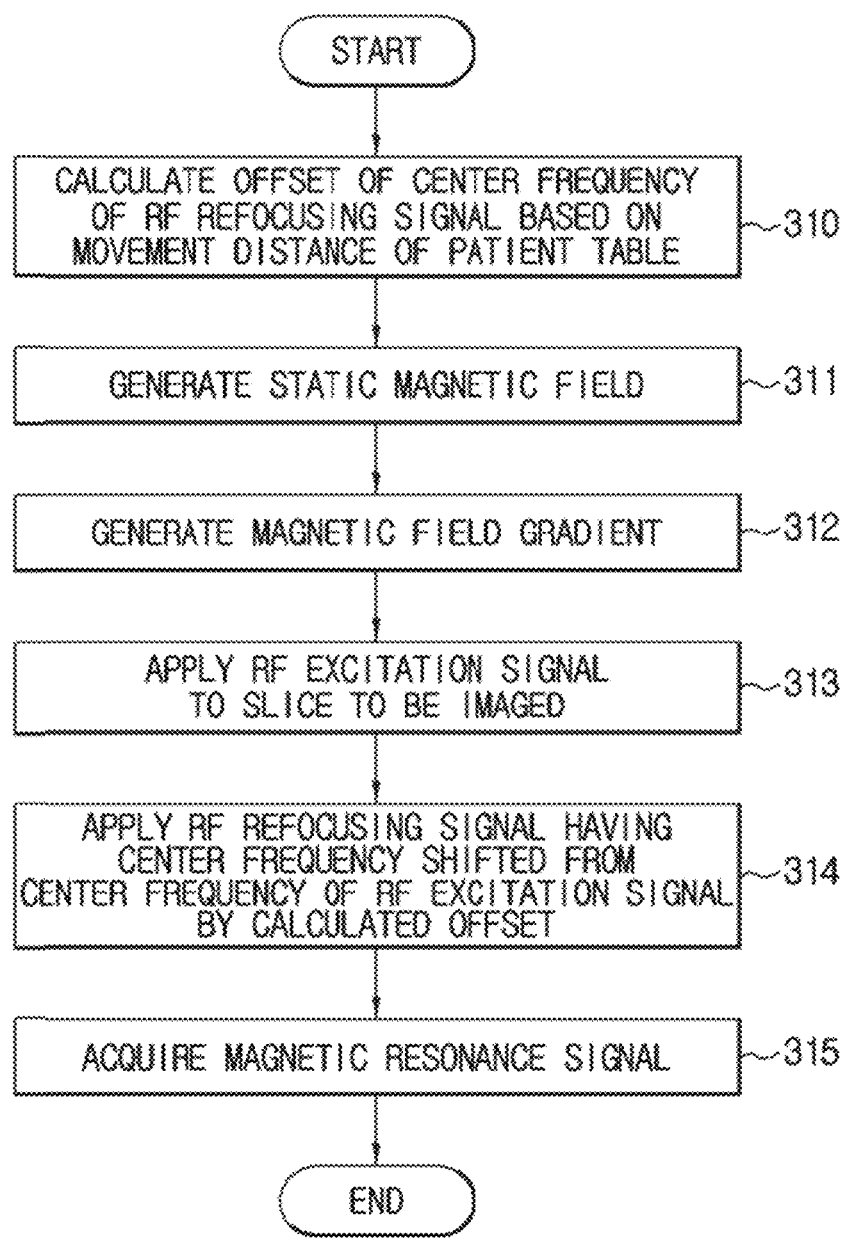
FIG. 17 is a flowchart showing a control method of an MRI apparatus according to an exemplary embodiment.

FIG. 17 is a flowchart showing a control method of an MRI apparatus according to an exemplary embodiment, in which the MRI apparatus continuously moves the patient table 101 during MRI.

Referring to FIG. 17, an offset of the center frequency of an RF refocusing signal is calculated based on movement distance of the patient table (operation 310). Information, such as movement speed of the patient table 101, a time echo, and a pulse sequence, may be set before MRI. For example, the offset of the center frequency of the RF may be calculated based on Equation 5. Here, the offset of the center frequency of the RF means a value to be shifted from the center frequency of an RF excitation signal to achieve conformity between a slice selected by the RF excitation signal and a slice selected by an RF refocusing signal.

Static magnetic field is generated in the bore in which an object is lying (operation 311). The static magnetic field is generated by applying current to the main magnet 151, which surrounds the bore. Generally, the direction of the static magnetic field is parallel to the longitudinal axis of the magnet assembly 150.

A gradient signal is applied to the generated static magnetic field to generate a gradient field (operation 312). Here, Z-when current is applied to the Z-axis gradient coils 152z, a Z-axis magnetic field gradient is generated in the bore. A slice may be selected by the Z-axis magnetic field gradient. After the Z-axis magnetic field gradient is generated, an X-axis magnetic field gradient and a Y-axis magnetic field gradient may be generated to encode a phase and a frequency.

An RF excitation signal is applied to a slice to be imaged (operation 313). Since a resonance frequency is changed according to position on the Z axis, an RF excitation signal having a resonance frequency corresponding to the slice to be imaged may be applied to select the slice to be imaged. In the flowchart, the RF excitation signal is applied after the gradient signal is applied. However, the gradient signal and the RF excitation signal may be simultaneously applied.

An RF refocusing signal having a center frequency shifted from the center frequency of the RF excitation signal by the calculated offset is applied (operation 314). When the RF refocusing signal has a center frequency shifted by the calculated offset, conformity between a slice selected by the RF excitation signal and a slice selected by the RF refocusing signal may be achieved.

Subsequently, an MR signal is acquired from the slice to be imaged (operation 315). When TE/2 elapses after the RF refocusing signal is applied, an echo signal is generated. This echo signal becomes an MR signal for the slice to be imaged. Since conformity between the slice selected by the RF excitation signal and the slice selected by the RF refocusing signal is achieved by shifting the center frequency of the RF refocusing signal, an MR signal for a desired slice may be acquired without reduction in thickness of the slice.

The above method may also be applied to a case in which MRI for multiple slices is performed. For each slice, the center frequency of the RF refocusing signal may be shifted by the calculated offset. When the MR signals for the multiple slices are simultaneously acquired, only movement of the patient table 101 may be considered between application of the RF excitation signal and application of the RF refocusing signal. When the MR signals for the multiple slices are acquired sequentially or in an interleaving fashion, movement of the patient table 101 is also considered between application of the RF refocusing signal to the previous slice and application of the RF excitation signal to the next slice.

In addition, a multi echo sequence may be applied. When the multi echo sequence is applied, the center frequency of each refocusing RF may be shifted according to movement distance of the patient table 101 whenever each refocusing RF is applied.

Figure 18:
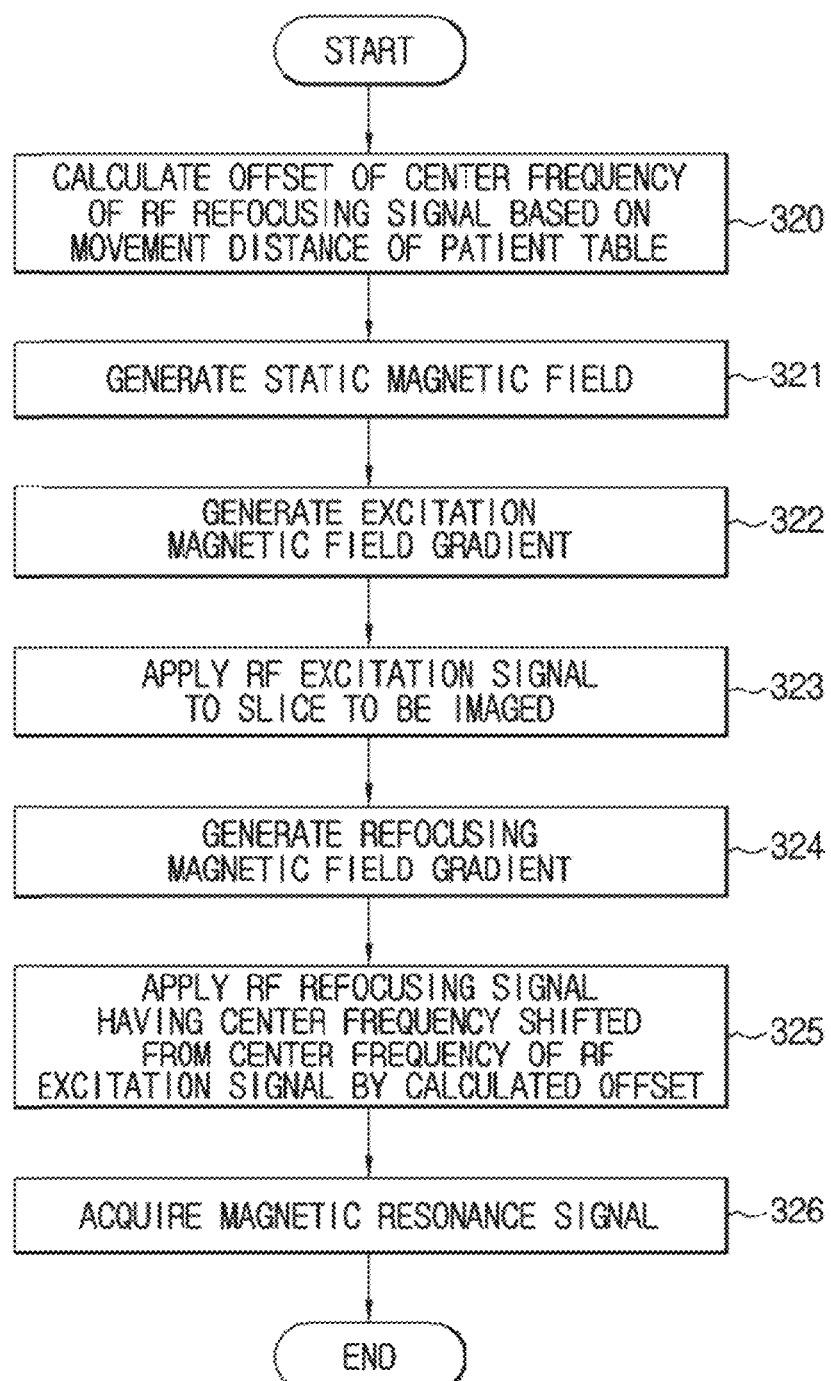
FIG. 18 is a flowchart showing an example of the control method of the MRI apparatus according to the exemplary embodiment when the gradient reversal technique is applied.

FIG. 18 is a flowchart showing an example of the control method of the MRI apparatus according to the exemplary embodiment when the gradient reversal technique is applied. The gradient reversal technique is setting the polarity of the gradient signal applied together with the RF excitation signal and the polarity of the gradient signal applied together with the RF refocusing signal so that the above polarities are opposite to each other to prevent an MR signal to be generated from an off-resonance component. The gradient reversal technique is described in detail above and, thus, a detailed description thereof will be omitted.

Referring to FIG. 18, an offset of the center frequency of an RF refocusing signal is calculated based on movement distance of the patient table (operation 320). Information, such as movement speed of the patient table 101, a time echo, and a pulse sequence, may be set before MRI. For example, the offset of the center frequency of the RF may be calculated using Equation 5. Since the gradient reversal technique is applied in an exemplary embodiment, the calculated offset is $f_{offset}=-\gamma g_z \Delta d/2\pi$.

Static magnetic field is generated in the bore (operation 321).

An excitation gradient is applied to the generated static magnetic field to generate an excitation gradient field (operation 322) and an RF excitation signal is applied to a slice to be imaged (operation 323). The excitation gradient signal and the RF excitation signal may be simultaneously applied. The excitation gradient signal forms a Z-axis magnetic field gradient and is applied together with the RF excitation signal.

A refocusing gradient field is generated (operation 324) and an RF refocusing signal having a center frequency shifted from the center frequency of the RF excitation signal by the calculated offset is applied (operation 325). The refocusing gradient signal and the RF refocusing signal may be simultaneously applied. The refocusing gradient signal forms a Z-axis magnetic field gradient and is applied together with the RF refocusing signal. Since the gradient reversal technique is applied in this embodiment, the polarity of the refocusing gradient field is opposite to that of the excitation gradient field.

When the RF refocusing signal has a center frequency shifted by the calculated offset, conformity between a slice selected by the RF excitation signal and a slice selected by the RF refocusing signal may be achieved.

Subsequently, an MR signal is acquired from the slice to be imaged (operation 326). When TE/2 elapses after the RF refocusing signal is applied, an echo signal is generated. This echo signal becomes an MR signal for the slice to be imaged. Since conformity between the slice selected by the RF excitation signal and the slice selected by the RF refocusing signal is achieved by shifting the center frequency of the RF refocusing signal, an MR signal for a desired slice may be acquired without reduction in thickness of the slice.

In addition, a multi echo sequence may be applied. When the multi echo sequence is applied, the center frequency of each refocusing RF may be shifted according to movement distance of the patient table 101 whenever each refocusing RF is applied.

The above method may also be applied to a case in which MRI for multiple slices is performed using the gradient reversal technique. For each slice, the center frequency of the RF refocusing signal may be shifted by the calculated offset. Since the gradient reversal technique is applied in this embodiment, the RF refocusing signal and the RF excitation signal for the second slice may have different ranges even when the patient table 101 is not moved.

Specifically, when the center frequency $f_{s2,ex}$ of the RF excitation signal for the second slice is a value shifted from the center frequency $f_{s1}$ for the first slice by $f_s$, the center frequency $f_{s2,re}$ of the RF refocusing signal for the second slice is a value shifted from $f_{s1}$ by $-f_s$.

When the MR signals for the multiple slices are simultaneously acquired, only movement of the patient table 101 may be considered between application of the RF excitation signal and application of the RF refocusing signal. When the MR signals for the multiple slices are acquired sequentially or in an interleaving fashion, movement of the patient table 101 is also considered between application of the RF refocusing signal to the previous slice and application of the RF excitation signal to the next slice. This is described in detail with reference to FIG. 16.

According to the MRI apparatus as described above and the control method thereof, conformity between the slice selected by the RF excitation signal and the slice selected by the RF refocusing signal may be achieved even when the patient table is moved during MRI.

In addition, even when MRI for multiple slices is performed, the center frequency may be shifted for each slice considering movement distance of the patient table, thereby achieving conformity between the slice selected by the RF excitation signal and the slice selected by the RF refocusing signal.

As apparent from the above description, according to the MRI apparatus and the control method thereof, the center frequency of the RF refocusing signal is shifted from that of the RF excitation signal considering movement distance of the patient table, thereby achieving conformity between the slice selected by the RF excitation signal and the slice selected by the RF refocusing signal.

The described-above exemplary embodiments and advantages are merely exemplary and are not to be construed as limiting. The present teaching can be readily applied to other types of apparatuses. The description of exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus to perform MRI while moving a patient table, the MRI apparatus comprising:
   a main magnet configured to generate a static magnetic field in a bore;
   a gradient coil assembly configured to apply a gradient signal to the static magnetic field to generate a magnetic field gradient;
   a radio frequency (RF) coil assembly configured to apply an RF excitation signal and an RF refocusing signal; and
   a controller configured to calculate a center frequency of the RF refocusing signal based on a movement distance of the patient table, and to control the RF coil assembly so that a slice to which the RF refocusing signal is to be applied conforms to the slice to which the RF excitation signal has been applied.

2. The MRI apparatus according to claim 1, wherein the controller is further configured to control the RF coil assembly to apply the RF refocusing signal having the calculated center frequency.

3. The MRI apparatus according to claim 2, wherein the controller is configured to calculate an offset $f_{offset}$ from a center frequency of the RF excitation signal based on the movement distance of the patient table.

4. The MRI apparatus according to claim 3, wherein the controller is configured to calculate a value shifted by the offset calculated from the center frequency of the RF excitation signal as the center frequency of the RF refocusing signal.

5. The MRI apparatus according to claim 4, wherein the controller is configured to calculate the movement distance of the patient table based on a movement speed of the patient table and a time echo, and the movement distance of the patient table is a movement distance between an application of the RF excitation signal and an application of the RF refocusing signal.

6. The MRI apparatus according to claim 5, wherein the controller is configured to calculate the offset as follows:

$$f_{offset} = \gamma g_z V(TE)/4\pi,$$

where γ is a proportional constant,
V is the movement speed of the patient table,
TE is the time echo, and
$g_z$ is a variation of the magnetic field gradient per a unit of distance.

7. The MRI apparatus according to claim 5, wherein the controller is configured to control the gradient coil assembly so that a polarity of the magnetic field gradient generated when the RF excitation signal is applied is opposite to a polarity of the magnetic field gradient generated when the RF refocusing signal is applied.

8. The MRI apparatus according to claim 5, wherein the MRI for multiple slices is performed, and
   the controller is configured to control the RF coil assembly to apply the RF refocusing signal having the center frequency shifted from the center frequency of the RF excitation signal by the calculated offset to each of the multiple slices.

9. The MRI apparatus according to claim 7, wherein, the controller is configured to control the RF coil assembly to apply the RF excitation signal having the center frequency $f_{s1}$ to a first slice and the RF excitation signal having the center frequency $f_{s1}+f_s$ to a second slice, wherein $f_s$ is an offset according to a slice selection, and to apply the RF refocusing signal having the center frequency $f_{s1}+f_{offset}$ to the first slice and the RF refocusing signal having the center frequency $f_{s1}-f_s+f_{offset}$ to the second slice, wherein $f_{offset}$ is the offset according to the movement distance of the patient table.

10. The MRI apparatus according to claim 5, wherein the controller is configured to control the RF coil assembly to apply a plurality of RF refocusing signals after application of the RF excitation signal according to a multi echo sequence and to shift the center frequency of each of the plurality of RF refocusing signals according to a movement of the patient table.

11. The MRI apparatus according to claim 9, wherein the controller is configured to adjust the center frequencies of the RF excitation signal and the RF refocusing signal to select an order of the multiple slices.

12. A control method of a magnetic resonance imaging (MRI) apparatus to perform MRI while moving a patient table, the control method comprising:
  generating, by the MRI apparatus, a static magnetic field in a bore;
  applying, by the MRI apparatus, a gradient signal to the static magnetic field to generate a first magnetic field gradient;
  applying, by the MRI apparatus, a radio frequency (RF) excitation signal to select a slice; and
  applying, by the MRI apparatus, an RF refocusing signal having a center frequency shifted by an offset from a center frequency of the RF excitation signal based on a movement distance of the patient table.

13. The control method according to claim 12, further comprising:
  calculating the center frequency of the RF refocusing signal based on the movement distance of the patient table.

14. The control method according to claim 13, wherein the calculating the center frequency of the RF refocusing signal comprises:
  calculating an offset $f_{offset}$ from the center frequency of the RF excitation signal based on the movement distance of the patient table.

15. The control method according to claim 14, wherein the calculating the center frequency of the RF refocusing signal comprises:
  calculating a value shifted by the offset calculated from the center frequency of the RF excitation signal as the center frequency of the RF refocusing signal.

16. The control method according to claim 15, wherein the calculating the offset $f_{offset}$ comprises calculating the movement distance of the patient table based on a movement speed of the patient table and a time echo,
  wherein the movement distance of the patient table is a movement distance between an application of the RF excitation signal and an application of the RF refocusing signal.

17. The control method according to claim 16, wherein the calculating the offset $f_{offset}$ further comprises calculating the offset as follows:

$$f_{offset}=\gamma g_z V(TE)/4\pi,$$

where $\gamma$ is a proportional constant,
V is the movement speed of the patient table,
TE is the time echo, and
$g_z$ is a variation of the magnetic field gradient per a unit of distance.

18. The control method according to claim 16, further comprising:
  generating a second magnetic field gradient having an opposite polarity to the generated first magnetic field gradient when the RF refocusing signal is applied.

19. The control method according to claim 16, further comprising:
  performing the MRI for multiple slices; and
  applying the RF refocusing signal having the center frequency shifted from the center frequency of the RF excitation signal by the calculated offset to each of the multiple slices.

20. The control method according to claim 18, further comprising: applying the RF excitation signal having the center frequency $f_{s1}$ to a first slice and the RF excitation signal having the center frequency $f_{s1}+f_s$ to a second slice; and
  applying the RF refocusing signal having the center frequency $f_{s1}+f_{offset}$ to the first slice and the RF refocusing signal having the center frequency $f_{s1}-f_s+f_{offset}$ to the second slice,
  wherein $f_s$ is the offset according to a slice selection, and $f_{offset}$ is the offset according to the movement distance of the patient table.

21. The control method according to claim 16, further comprising:
  applying a plurality of RF refocusing signals; and
  shifting the center frequency of each of the plurality of RF refocusing signals according to a movement of the patient table.

22. A magnetic resonance imaging (MRI) apparatus comprising:
  a main magnet configured to generate a static magnetic field in a bore of an MRI scanner;
  a gradient coil assembly configured to form a magnetic field gradient in the bore;
  a radio frequency (RF) coil assembly configured to apply an RF excitation signal to a first slice at a first spatial position in the bore and to apply an RF refocusing signal after a time delay; and
  a processor programmed to control the RF coil assembly so that the RF refocusing signal is applied to a same first slice positioned at a second spatial position in the bore, which differs from the first spatial position according to a movement distance of a patient table in the bore.

23. The MRI apparatus according to claim 22, wherein the processor is programmed to determine a center frequency of the RF refocusing signal to be offset from a center frequency of the RF excitation signal based on the movement distance of the patient table between an application of the RF excitation signal and an application of the RF refocusing signal, and control the RF coil assembly to apply the RF refocusing signal having the offset center frequency.

24. The MRI apparatus according to claim 23, wherein the processor is programmed to determine the offset as being directly proportional to a product of a speed V of the patient table, the time delay (TE/2), and a variation of a value of a Z-axis magnetic field gradient $g_z$ per a unit of distance and inversely proportional to $2\pi$.

25. The MRI apparatus according to claim 22, wherein the processor is programmed to control the gradient coil assembly to reverse a direction of a Z-axis magnetic field gradient when applying the RF refocusing signal.

* * * * *